United States Patent [19]

Patil et al.

[11] Patent Number: 5,672,911

[45] Date of Patent: Sep. 30, 1997

[54] APPARATUS TO DECOUPLE CORE CIRCUITS POWER SUPPLY FROM INPUT-OUTPUT CIRCUITS POWER SUPPLY IN A SEMICONDUCTOR DEVICE PACKAGE

[75] Inventors: Sadanand R. Patil, San Jose; Tai-Yu Chou, Pleasonton; Prabhansu Chakrabarti, Sunnyvale, all of Calif.

[73] Assignee: LSI Logic Corporation, Milpitas, Calif.

[21] Appl. No.: 655,599

[22] Filed: May 30, 1996

[51] Int. Cl.⁶ .................. H01L 23/52; H01L 23/48
[52] U.S. Cl. .................. 257/691; 257/698; 257/700; 257/693
[58] Field of Search .................. 257/691, 698, 257/700, 693, 697

[56] References Cited

U.S. PATENT DOCUMENTS

| | | | |
|---|---|---|---|
| 4,551,746 | 11/1985 | Gilbert et al. | 257/691 |
| 4,551,747 | 11/1985 | Gilbert et al. | 257/691 |
| 5,089,881 | 2/1992 | Panicker | 257/691 |
| 5,218,230 | 6/1993 | Tamamura et al. | 257/691 |
| 5,513,076 | 4/1996 | Werther | 257/698 |

Primary Examiner—Mahshid D. Saadat
Assistant Examiner—S. V. Clark
Attorney, Agent, or Firm—Kevin L. Daffer; Conley, Rose & Tayon

[57] ABSTRACT

A semiconductor device package for one or more semiconductor dice uses a package substrate having one pair of biplanar conductive planes and another pair of biplanar conductive planes. The pairs of planes are positioned in a coplanar relationship between the top traces and the bottom traces. Power may be supplied to die core circuits through one pair of planes and to die input-output circuits through another pair of planes to decouple the core circuits from the input-output circuits and minimize noise induced false switching in either set of circuits. The core circuits and the input-output circuits may be powered by the same power supply or separate power supplies.

21 Claims, 20 Drawing Sheets

APPARATUS TO DECOUPLE CORE CIRCUITS POWER SUPPLY FROM INPUT-OUTPUT CIRCUITS POWER SUPPLY IN A SEMICONDUCTOR DEVICE PACKAGE

BACKGROUND OF THE INVENTION

1. Cross Reference to Related Patent Applications

This patent application is related to U.S. patent application Ser. No. 08/656,033 filed concurrently herewith, and which is entitled "Wire Bondable Package Design With Maximum Electrical Performance And Minimum Number Of Layers" by Tai Yu Chou and Sanjay Dandia, and which is hereby incorporated by reference.

2. Field of the Invention

The present invention relates generally to semiconductor packages, and more particularly, to an apparatus for electrical power distribution to a semiconductor die in a semiconductor package.

3. Description of the Related Technology

In order to facilitate handling and connection of a semiconductor die to an external system, a common practice in the semiconductor industry is to package the die. Die packaging usually involves physically attaching and electrically connecting a semiconductor die to a package substrate to form a semiconductor device assembly. The package substrate can then be electrically connected to an external system (hereinafter the term "connect" or any word using the root word "connect," such as "connects," "connected," "connecting," "connection" or "connector" refer to electrical connections unless the context is specifically modified by another word, such as "thermal connection" or "mechanical connector").

A semiconductor die may be divided into two main parts: input-output circuits and core circuits. The input-output circuits receive all signals sent to the die from the external system, where the received signals are buffered by the input-output circuits and sent on to the core circuits. The core circuits process the received signals and generate resultant signals which are then sent back to the input-output circuits, where the resultant signals are buffered and transmitted back to the external system. In addition to receiving, processing, and returning signals, the input-output circuits and core circuits must be provided with direct current electric power. All signals and power enter and exit the semiconductor die through bond pads attached to the active face of the die.

A package substrate may be constructed from ceramic, printed circuit board (PCB, also known as printed wiring board or PWB) using epoxy laminates, or the like. The package substrate has a top surface (commonly referred to as a top surface and not indicative of orientation to external references), a central die receiving area on the top surface, conductive traces having bond fingers at their inner ends and located on the top surface surrounding the periphery of the die receiving area. The semiconductor die is centrally located in the die receiving area and the bond pads on the die are electrically connected using bond wires, solder bumps (if the die is a "flip chip"), or the like to the respective trace bond fingers on the package substrate. The traces typically connect to vias (plated through holes) or the like, which pass through the package substrate to another surface (commonly referred to as a bottom surface and not indicative of orientation to external references) opposite the top surface, where the vias exit the package substrate and connect to other traces which usually terminate in external connectors such as ball bumps, pins or the like (hereinafter external connectors). The completed semiconductor device assembly is connected to an external system where the package substrate acts as an intermediate pathway through which all signals and power pass to and from the die. FIGS. 1, 2a, 2b, 3 and 4 illustrate typical prior art semiconductor device assemblies. FIG. 1 illustrates a prior art package substrate utilizing a single dielectric (insulating) layer package substrate (hereinafter the term "insulate" or any word using the root word "insulate," such as "insulates," "insulated," "insulating," "insulation" or "insulator" refer to electrical insulation unless the context is specifically modified by another word, such as "thermal insulation" or "thermal insulator"). FIGS. 2a, 2b and 3 illustrate prior art package substrates utilizing three dielectric layers. FIG. 4 illustrates a prior art package substrate utilizing five dielectric layers.

Referring now to FIG. 1, a prior art semiconductor device assembly 100 is illustrated in schematic cutaway elevational view. Assembly 100 has a flip chip semiconductor die 102 and a package substrate 104. The package substrate 104 utilizes a single dielectric (insulating) layer 106. The top surface 108 has a centrally located die receiving area 110 surrounded by top traces 112 (only two of many such top traces are shown for illustrative clarity). The semiconductor die 102 has bond pads 114 (only two of many such bond pads are shown for illustrative clarity) which electrically connect on a one to one basis with the top traces 112. Each of the top traces 112 electrically connect on a one to one basis to vias 116 (only five of many such vias are shown for illustrative clarity). The vias further electrically connect to respective bottom traces 118 (only five of many such bottom traces are shown for illustrative clarity) on the bottom surface 120, the bottom traces terminating in external connectors 122 (here illustrated as solder ball bumps, and only a few of many such external connectors are shown for illustrative clarity).

In this prior art package substrate 104, each semiconductor bond pad 114 is uniquely associated with a dedicated pathway comprising a top trace 112, a via 116, a bottom trace 118 and an external connector 122. Therefore each bond pad on the semiconductor die used for connecting positive or negative voltages for power to the core circuits (not specifically illustrated), and each bond pad on the semiconductor die used for connecting positive or negative voltages for power to the input-output circuits (not specifically illustrated), as well as all of the semiconductor signal bond pads (not specifically illustrated), has an associated dedicated pathway.

As semiconductor die performance increases, parasitic inductances of the dedicated signal pathways and the dedicated positive and negative voltage power pathways (to either or both the core circuits and the input-output circuits) become significant. A way to minimize some of these parasitic inductances is to electrically connect all of the positive voltage power pathways to a first conductive plane which is positioned between the top traces and the bottom traces, and to connect all of the negative voltage power pathways to a second conductive plane which is biplanar with the first conductive plane and is also positioned between the top traces and bottom traces (hereinafter the term "conduct" or any word using the root word "conduct," such as "conducts," "conducted," "conducting," "conduction," "conductive" or "conductor" refer to electrical conduction unless the context is specifically modified by another word, such as "thermal conduction" or "thermal conductor").

Referring now to FIGS. 2a and 2b, a prior art semiconductor device assembly 200 having first and second conductive planes 224a,b is illustrated. FIG. 2a is a schematic cutaway elevational view. FIG. 2b is a schematic partial cut out plan view where three quadrants 22, 23 and 24 of the semiconductor device assembly 200 have been carved out to successively greater depths (i.e. from the top surface to the bottom surface) for the purpose of illustration. Similar to assembly 100, assembly 200 has a semiconductor die 202 (illustrated only in FIG. 2a) and a package substrate 204. The package substrate 204 has a top surface 208 with a die receiving area 210 surrounded by top traces 212 (partially illustrated in quadrant 21 in FIG. 2b), and a bottom surface 220 with bottom traces 218 and external connectors 222 (partially illustrated in quadrant 24 in FIG. 2b).

Unlike the assembly 100, assembly 200 has three dielectric layers 206a,b,c. The three dielectric layers 206a,b,c, respectively, electrically insulate the top traces 212 from the first conductive plane 224a, the first conductive plane 224a from the second conductive plane 22 4b, and the second conductive plane 22 4b from the bottom traces 218 and the external connectors 222. The first conductive plane 224a is partially illustrated in quadrant 22 in FIG. 2b, and the second conductive plane 224b is partially illustrated in quadrant 23 in FIG. 2b. The semiconductor die 202 has bond pads 214 (only two of many such bond pads are shown in FIG. 2a for illustrative clarity) which connect on a one to one basis with the top traces 212 using wire bonds 226 (only two of many such wire bonds are shown in FIG. 2a for illustrative clarity).

Each top trace 212e used to carry signals to or from the die 202 is connected on a one to one basis to a respective bottom trace 218e and external connector 222e by a signal via 216e (only one of many such signal vias are shown in FIG. 2a for illustrative clarity). The signal vias 216e pass through the three dielectric layers 206a,b,c, and through electrically insulating holes 228a,b respectively in the first and second conductive planes 224a,b.

All positive voltage power pathways connect to one conductive plane and all negative voltage power pathways connect to the other conductive plane. For example, each core circuit positive voltage power top trace 212a is connected to a via 216a which connects to the first conductive plane 224a. Each input-output circuit positive voltage power trace 212c is connected to a via 216c which also connects to the first conductive plane 224a. The first conductive plane 224a is further connected by via 216p to a bottom trace 218p and external connector 222p.

Each core circuit negative voltage power top trace 212b is connected to a via 216b which connects to the second conductive plane 224b. Each input-output circuit negative voltage power trace 212d is connected to a via 216d which also connects to the second conductive plane 224b. The second conductive plane 224b is further connected by via 216n to a bottom trace 218n and external connector 222n.

Although the package substrate 204 minimizes the parasitic inductances between the dedicated signal pathways and the positive and negative voltage power pathways, it has two disadvantages. First, as the quantity of core circuits and input-output circuits increase in modem semiconductor dies, the impact on ground bounce becomes increasingly important. If the noise generated by core circuit switching activity (referred to as core noise) and the noise generated by input-output simultaneous switching activity (referred to as simultaneous switching noise or SSN) becomes great enough, ground bounce can become pronounced enough that the use of common power planes may result in undesirable false switching in the core circuits and/or the input-output circuits. End users of semiconductor devices using this arrangement have been forced, under some circumstances, to down grade their system performance to accommodate and minimize this phenomenon.

Second, package substrate 204 does not provide a way to connect separate power sources to the core circuits and the input-output circuits. Separate power sources to the core circuits and the input-output circuits are desirable to minimize false switching due to ground bounce, and also when the core circuits require power at one voltage potential (for example 5 volts) and the input-output circuits require power at another voltage potential (for example 3.3 volts).

FIGS. 3 and 4 illustrate in schematic cutaway elevational views two prior art semiconductor device assemblies 300 and 400 respectively. Semiconductor device assemblies 300 and 400 both attempt to overcome the deficiencies of the package substrate 204 of assembly 200 by decoupling the core circuit power pathways from the input-output circuit pathways.

Referring now to FIG. 3, package substrate 304 decouples the core circuit power pathways from the input-output circuit power pathways by, for example, not electrically connecting the core circuit power pathways to either the first or second power planes 224a,b. Instead, each core circuit positive voltage power top trace 312a (not specifically illustrated) is connected to a via 316a which is connected a bottom trace 318a and external connector 322a, and each core circuit negative voltage power top trace 312b is connected to a via 316b which is connected a bottom trace 318b and external connector 322b. Although package substrate 304 minimizes the false switching associated with package substrate 204, the increased impedance on the core circuit power pathway can compromise the performance of the semiconductor die core circuits.

Referring now to FIG. 4, package substrate 404 decouples the core circuit power pathways from the input-output circuit power pathways by not electrically connecting the core circuit power pathways to either the first or second power planes 224a,b, but instead, by providing two additional power planes 424a,b, and two additional dielectric layers 406a,b. Although package substrate 404 also minimizes the false switching associated with package substrate 204, the increased number of dielectric layers and power planes can make the package substrate 404 unacceptably thick, as well as, having increased manufacturing costs of 20 to 40 percent, and increased manufacturing defects thus reducing manufacturing yields.

What is needed is a semiconductor device assembly which will: minimize package substrate parasitic inductances between the dedicated signal pathways and both the core circuit and input-output circuit power pathways; minimize false switching in the semiconductor die core circuits and/or the input-output circuits; allow separate power sources, with substantially the same or different voltage potentials, to be connected to the core circuits and input-output circuits with minimum power pathway impedances; and utilizing a package substrate with three dielectric layers, so that the package substrate has an acceptable thickness and acceptable manufacturing yields.

SUMMARY OF THE INVENTION

Objects of the Invention

An object of the invention is to create a semiconductor device assembly with a package substrate having three dielectric layers and two or more pairs of conductive planes, thereby minimizing the number of layers needed to provide input-output trace routing, external connectors, a pair of planes for input-output power and ground, and a pair of planes for core power and ground.

Another object of the present invention is to create a semiconductor device assembly where the semiconductor die core circuits power pathways are connected to a first pair of biplanar conductive power planes (VDD and VSS) and the input-output power pathways are connected to a second pair of biplanar conductive power planes (VDD2 and VSS2), where the first and second pair of power planes are isolated, and the package substrate has three dielectric layers.

Another object of the present invention is to create a semiconductor device assembly with a package substrate which minimizes ground bounce induced false switching in the semiconductor die core circuits and/or input-output circuits, and also minimizes impedance in both the core circuit power pathways and the input-output power pathways.

Another object of the present invention is to create a semiconductor device assembly with a package substrate which minimizes inductance in the core power pathways and the input-output power pathways to reduce switching noise resulting from core logic switching and input-output switching.

Another object of the present invention is to create a semiconductor device assembly with a package substrate which has a minimized number of layers for cost reduction.

Another object of the present invention is to create a semiconductor device assembly where the input-output power planes and the core power planes are decoupled using a minimum number of dielectric layers in a package substrate to improve package performance.

Another object of the present invention is to create a semiconductor device assembly with a package substrate which has optimized electrical performance.

An advantage of the present invention is the ability to connect the semiconductor die core circuits to a first power supply having a voltage potential, and to connect the input-output circuits to another power supply having the same or a different voltage potential from the first power supply or from an independent second power supply.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

Disclosure of the Invention

According to the present invention, the foregoing and other objects, advantages and features are attained by a semiconductor device assembly having a package substrate and one or more semiconductor dice. The package substrate has a top surface, a bottom surface and first and second conductive patterns. The top surface is separated from the first conductive pattern by a dielectric layer, the first conductive pattern is separated from the second conductive pattern by another dielectric layer, and the second conductive pattern is separated from the bottom surface by yet another dielectric layer.

The bottom surface has many signal external connectors and one or more first power external connectors, one or more second power external connectors, one or more third power external connectors, and one or more fourth power external connectors.

The first conductive pattern has coplanar first and third conductive planes which are insulated from one another. The first conductive plane is connected to the one or more first power external connectors, and the third conductive plane is connected to the one or more third external connectors.

The second conductive pattern has coplanar second and fourth conductive planes which are insulated from one another. The second conductive plane is connected to the one or more second external connectors, and the fourth conductive plane is connected to the one or more fourth external connectors. The first and second planes are in a biplanar relationship, forming an electrical capacitance. The third and fourth planes are in a biplanar relationship, forming an electrical capacitance.

The one or more semiconductor dice each have core circuits, input-output circuits, and an active face with many signal bond pads, one or more first power bond pads for the core circuits, one or more second power bond pads for the core circuits, one or more third power bond pads for the input-output circuits, and one or more fourth power bond pads for the input-output circuits.

The one or more semiconductor dice are located on the top surface of the package substrate. The many signal bond pads connect on a one to one basis to many signal top traces, which connect to the many signal vias, which connect to the many bottom signal traces, which connect to the many signal external connectors, forming many signal pathways.

The one or more first power bond pads are connected to the first conductive plane, and the one or more second power bond pads are connected to the second conductive plane, thereby completing the electrical connection of the first and second power bond pads to the first and second power external connectors, respectively, and forming first and second core circuits power pathways.

The one or more third power bond pads are connected to the third conductive plane, and the one or more fourth power bond pads are connected to the fourth conductive plane, thereby completing the electrical connection of the third and fourth power bond pads to the third and fourth power external connectors, respectively, and forming third and fourth input-output circuit power pathways.

Because the first and second core circuits power pathways connect through the first and second conductive planes, respectively, and the third and fourth input-output circuits power pathways connect through the third and fourth conductive planes, respectively, the electrical power for the core circuits is decoupled from the electrical power for the input-output circuits. This decoupling minimizes false switching in the semiconductor die core circuits and/or the input-output circuits caused by core noise or simultaneous switching noise induced ground bounce. Further, because all of the power pathways connect through the conductive planes, all of the power pathways have minimized impedances, as well as minimized parasitic inductances of the signal pathways and the power pathways.

The one or more first power external connectors may be connected to a first voltage, and the one or more second power external connectors may be connected to a second voltage. The one or more third power external connectors may be connected to a third voltage, and the one or more fourth power external connectors may be connected to a fourth voltage. The first and second voltages are derived from a first power supply, and the third and fourth voltages may be derived from either the first power supply or a second power supply.

Whether connected to one or two power supplies, the first voltage may be negative with respect to the second voltage, and the third voltage may be negative with respect to the fourth voltage. If two power supplies are used, the first voltage and the third voltage may be connected together so that the voltage difference between the first voltage and the third voltage (as measured at the external connectors) is substantially zero volts. On the other hand the first voltage may be positive with respect to the second voltage, and the third voltage may be positive with respect to the fourth voltage. If two power supplies are used, the second voltage and the fourth voltage may be connected together so that the voltage difference between the second voltage and the fourth voltage (as measured at the external connectors) is substantially zero volts.

Whether connected to one or two power supplies, the voltage difference between the first voltage and the second voltage (as measured at the external connectors) may be substantially the same as the voltage difference between the third voltage and the fourth voltage (as measured at the external connectors). For example, the voltage difference between the first and second voltages may be between 4.5 volts to 5.5 volts, and the voltage difference between the third and fourth voltages may also be between 4.5 volts to 5.5 volts. Conversely, the voltage difference between the first and second voltages (as measured at the external connectors) may be substantially different from the voltage difference between third and fourth voltages (as measured at the external connectors). For example, the voltage difference between the first and second power external connectors may be between 4.5 volts to 5.5 volts, and the voltage difference between the third and fourth power external connectors may be between 2.5 volts to 4.0 volts, or vica-versa.

Other and further objects, features and advantages will be apparent from the following description of the presently preferred embodiments of the invention, given for the purpose of disclosure and taken in conjunction with the accompanying drawings.

DETAILED DESCRIPTION OF PREFERRED EMBODIMENTS

Figure 1:
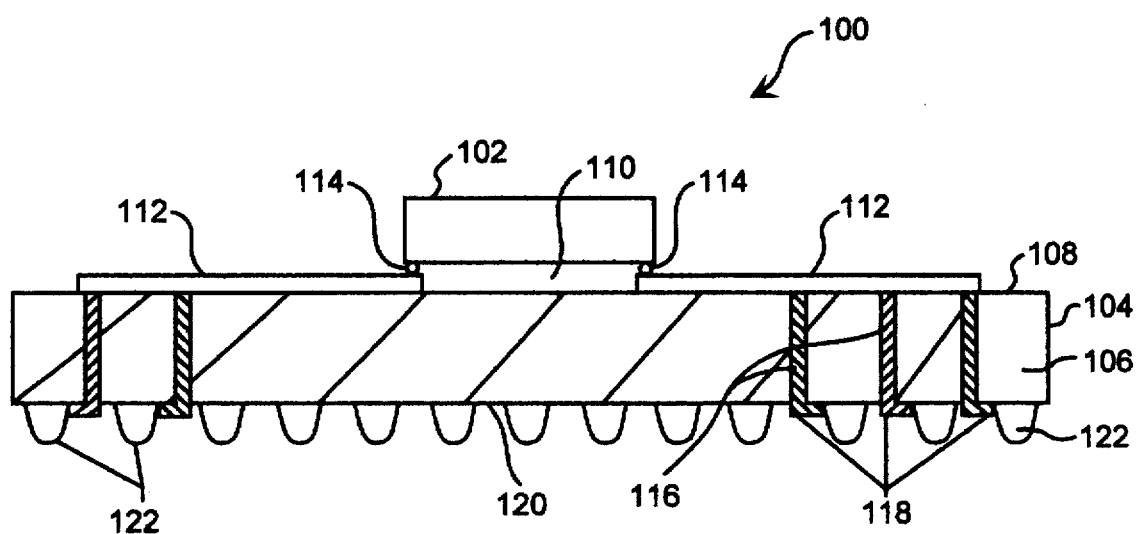
FIG. 1 is a schematic cutaway elevational view of a prior art semiconductor device assembly.
Figure 2A:
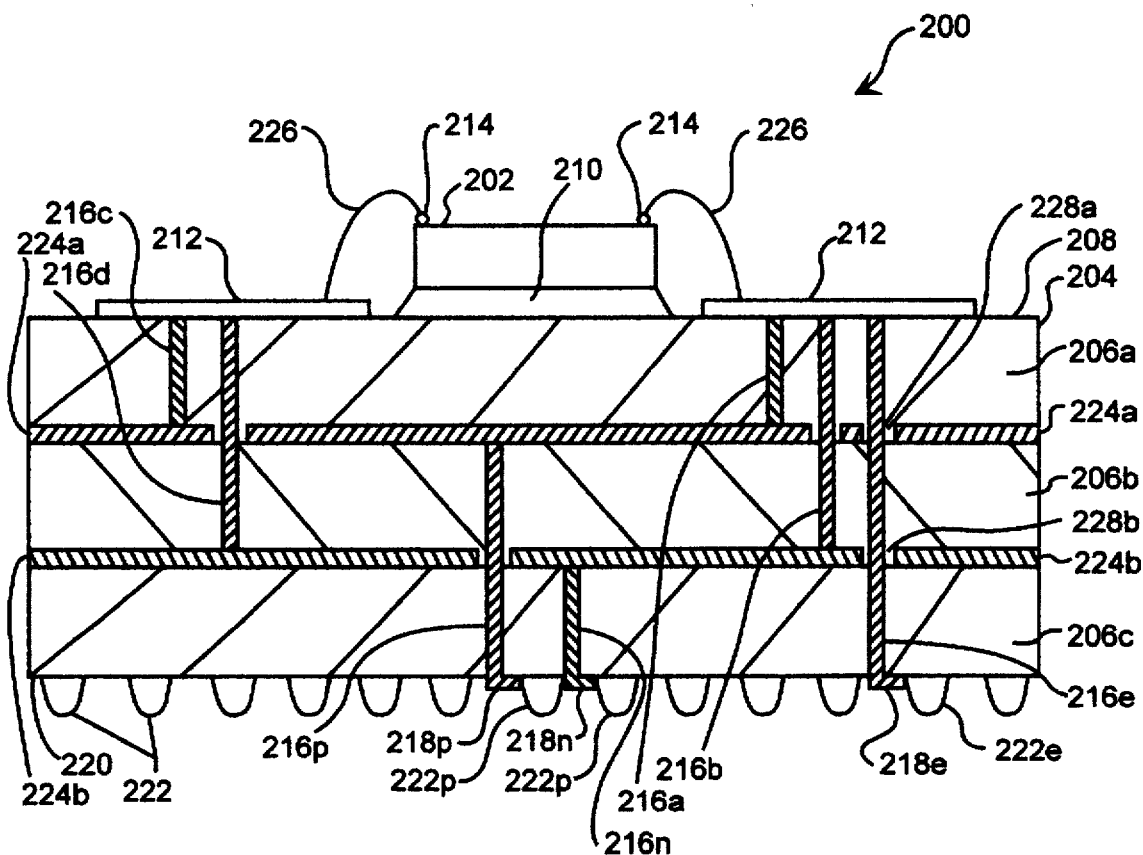
FIG. 2a is a schematic cutaway elevational view of a prior art semiconductor device assembly.
Figure 2B:
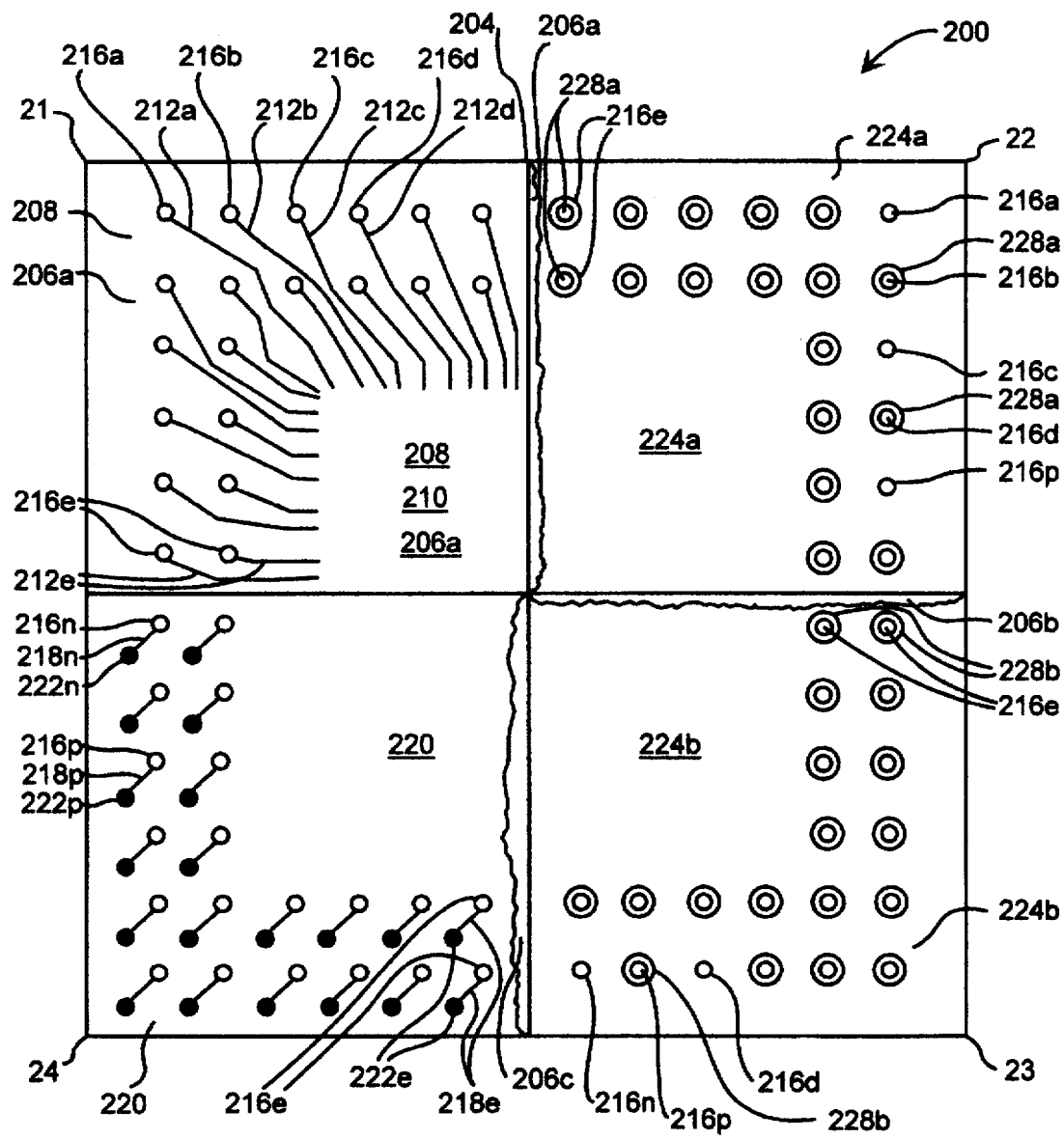
FIG. 2b is a schematic partial cut out plan view of a prior art semiconductor device assembly.
Figure 3:
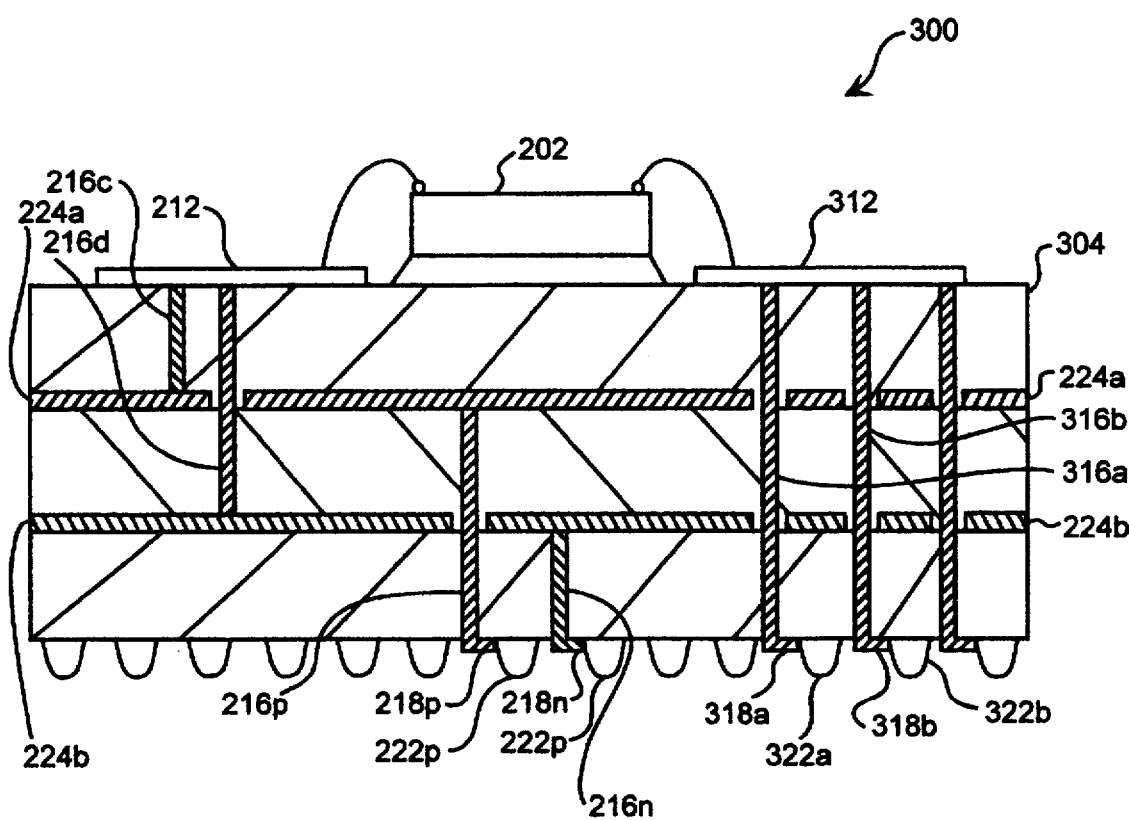
FIG. 3 is a schematic cutaway elevational view of a prior art semiconductor device assembly.
Figure 4:
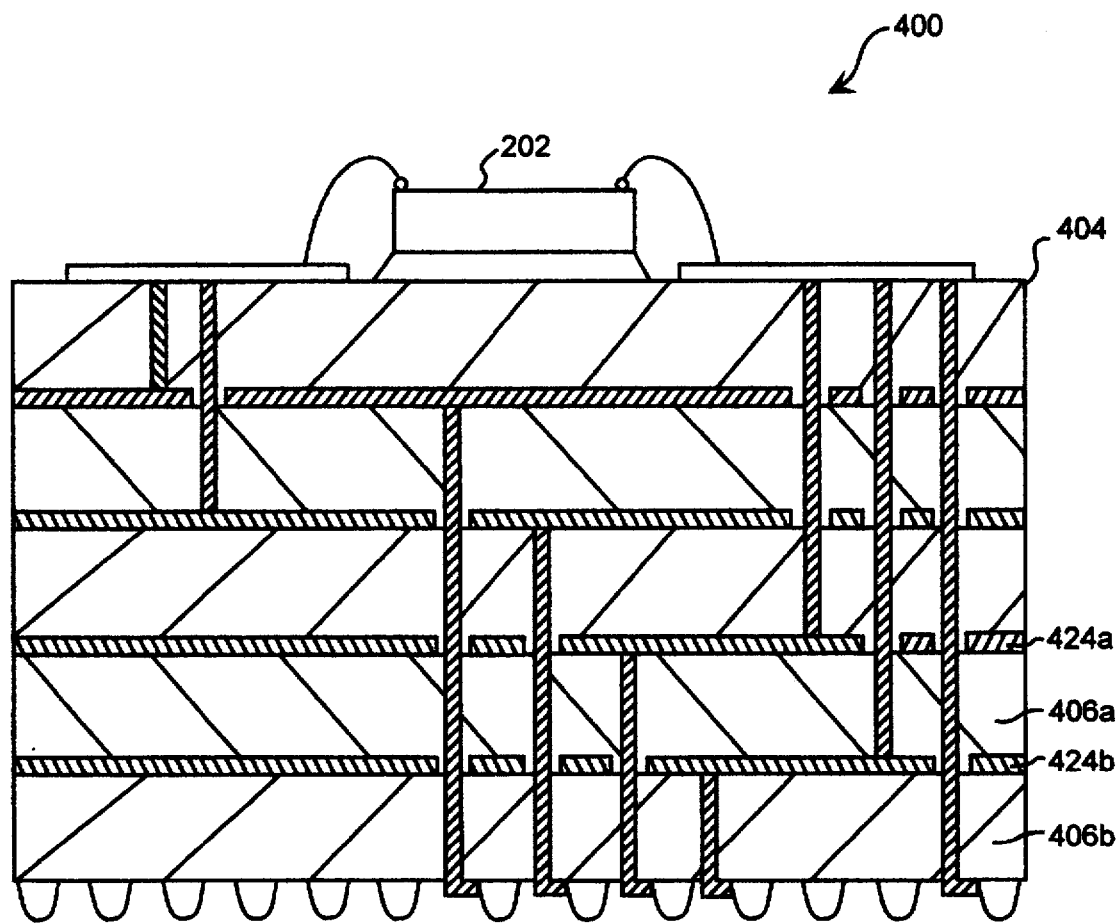
FIG. 4 is a schematic cutaway elevational view of a prior art semiconductor device assembly.

A better understanding of the present invention will be obtained when the following detailed description is read with reference to the drawings. In the drawings like elements are numbered the same, and similar elements are represented by the same number and a different lower case letter suffix.

Figure 5A:
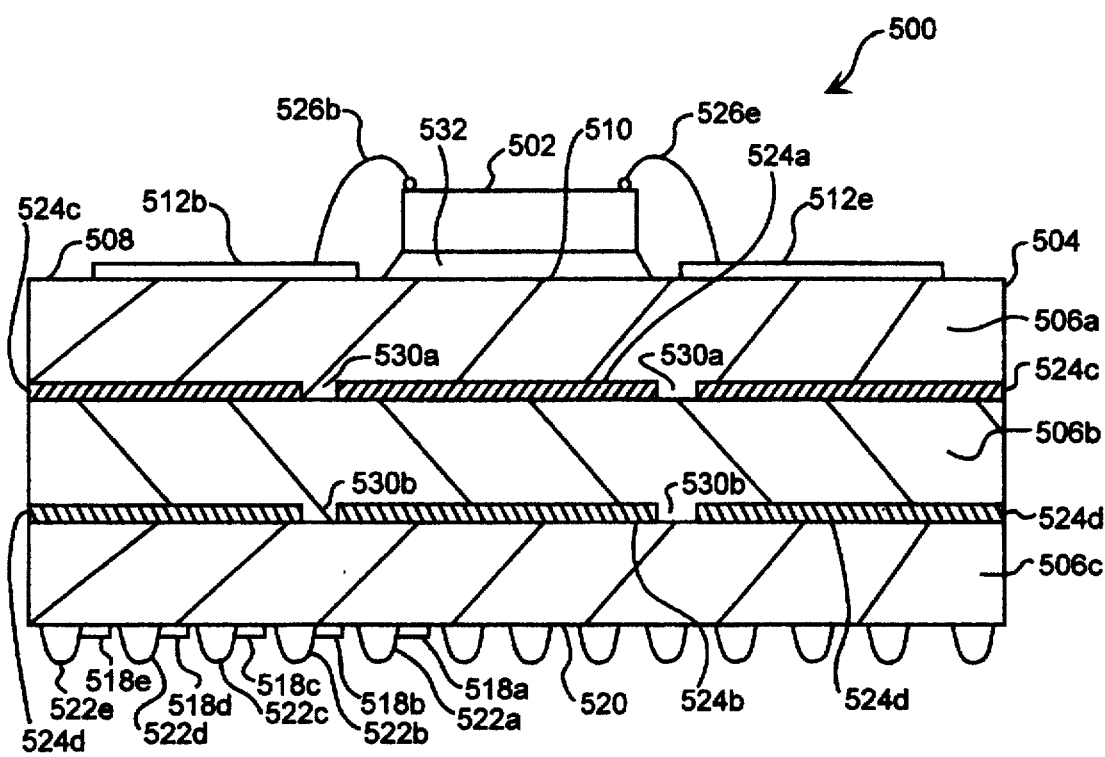
FIGS. 5a and 5b are two schematic cutaway elevational views of the present invention.
Figure 5B:
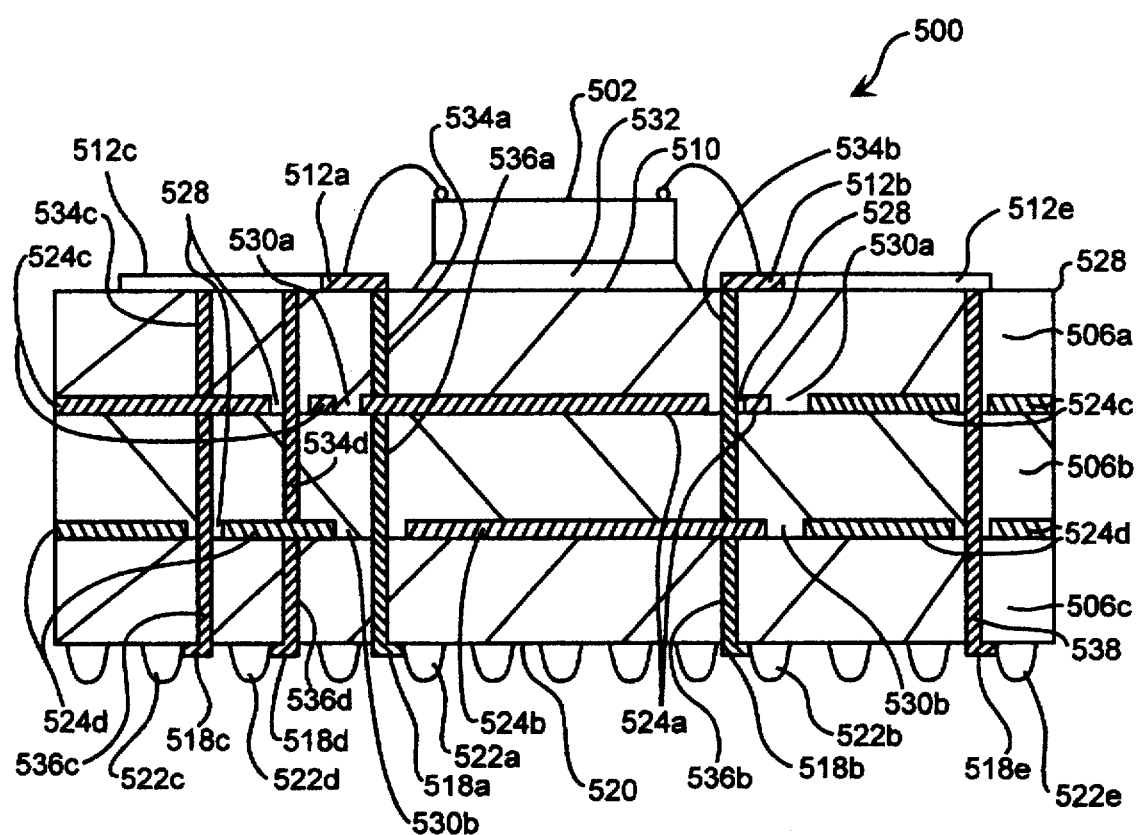

Referring now to FIGS. 5a, 5b, 5c, 5d and 5e, a preferred embodiment of the of the present invention is illustrated. FIGS. 5a and 5b illustrate the present invention in two different schematic cutaway elevational views. FIG. 5a shows the present invention where, for the purpose of illustration, the view of the conductive planes is unobstructed by the view of vias. FIG. 5b shows how the conductive planes are integrated with the vias.

Figure 5C:
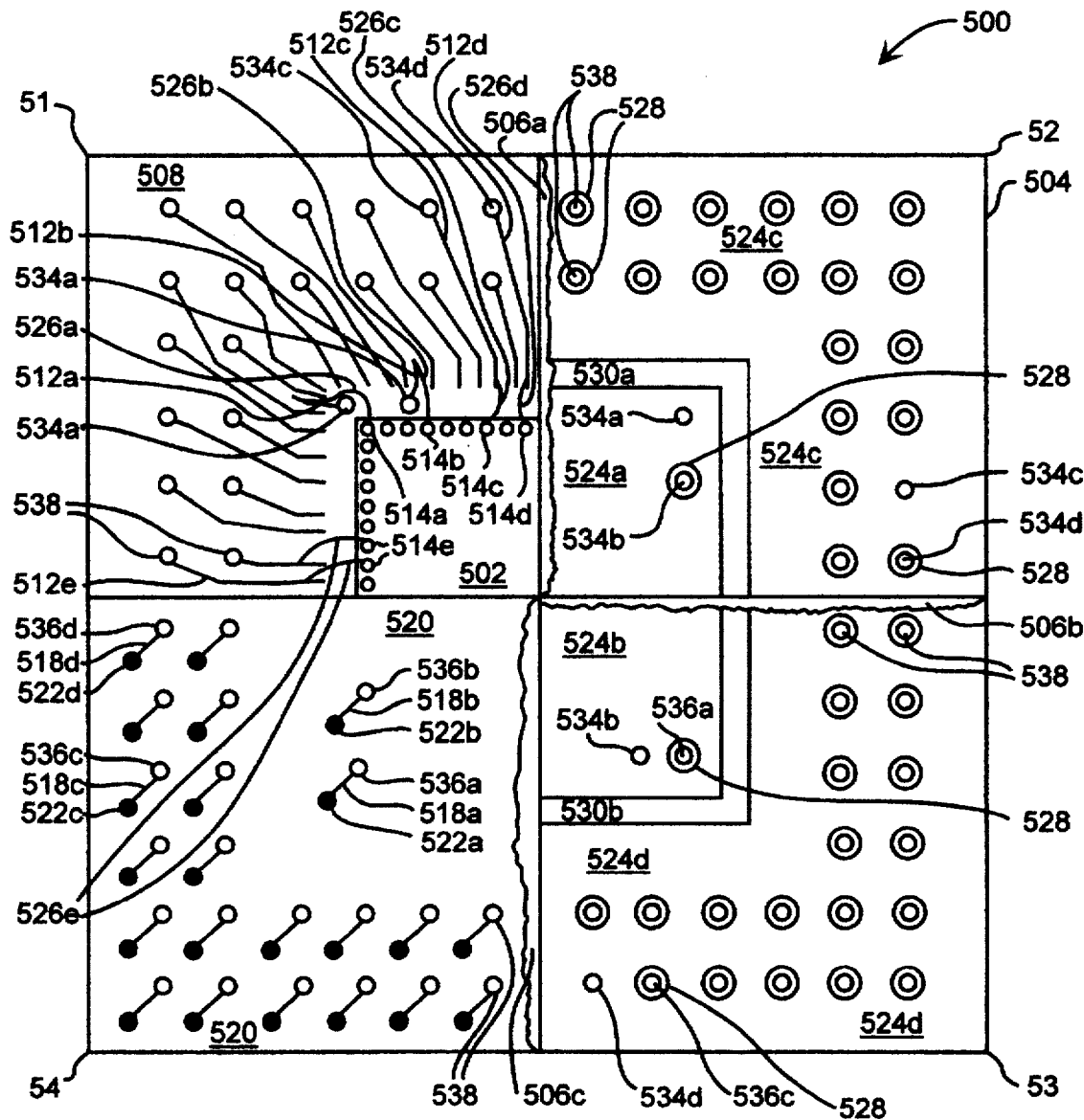
FIG. 5c is a schematic partial cut out plan view of the present invention.

FIG. 5c illustrates the present invention in schematic partial cut out plan view where three quadrants 52, 53 and 54 of the semiconductor device assembly 500 have been carved out to successively greater depths (i.e. from the top surface to the bottom surface) for the purpose of illustration.

Figure 5D:
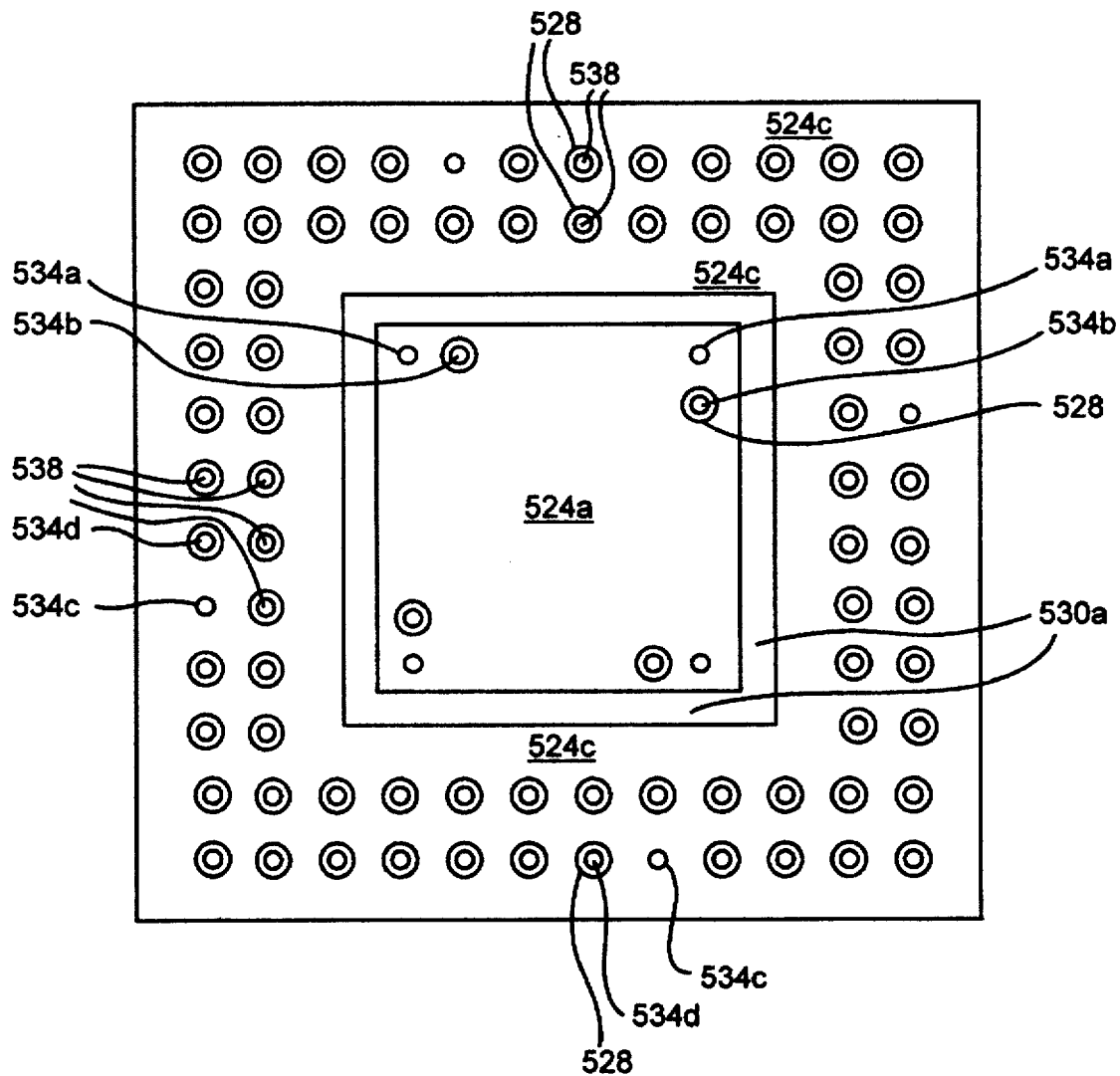
FIGS. 5d and 5e are two schematic cut out plan views of the present invention.
Figure 5E:
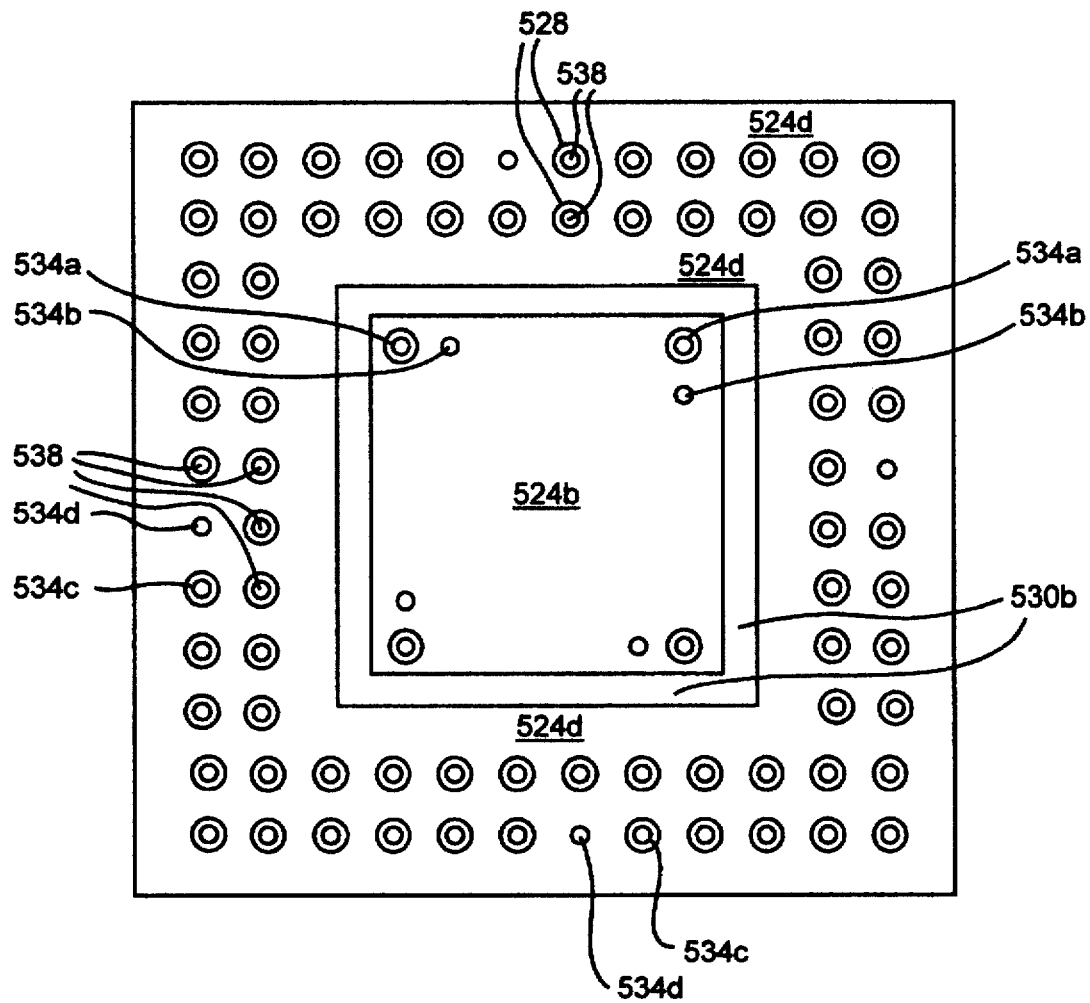

FIGS. 5d and 5e illustrate the present invention in two schematic cut out plan views. FIG. 5d shows the present invention where, for the purpose of illustration, the first dielectric layer 506a has been cut out to expose the first conductive pattern. FIG. 5e shows the present invention where, for the purpose of illustration, the first and second dielectric layers 506a and 506b have been cut out to expose the second conductive pattern.

Semiconductor device assembly 500 has a semiconductor die 502 (partially illustrated in quadrant 51 in FIG. 5c) and a package substrate 504. The package substrate 504 has a top surface 508 with a die receiving area 510 surrounded by top traces 512a–e (partially illustrated in quadrant 51 in FIG. 5c), and a bottom surface 520 with bottom traces 518a–e and external connectors 522a–e (partially illustrated in quadrant 54 in FIG. 5c). The top traces 512a–e and the bottom traces 518a–e may be fabricated from gold alloys, aluminum alloys, copper alloys or the like. The external connectors 522a–e may be solder ball bumps (illustrated), pins (not illustrated) or the like.

As best viewed in FIGS. 5a and 5b, the semiconductor die 502 is located on the package substrate 504 in the die receiving area 510. The die 502 may be mechanically attached to the package substrate 504 in the die receiving area 510 using epoxy 532 or other organic or inorganic adhesives or the like.

As best viewed in FIG. 5c, the die 502 has core circuits (not illustrated), inputs-output circuits (not illustrated), first power bond pads 514a for the core circuits, second power bond pads 514b for the core circuits, third power bond pads 514c for the input-output circuits, fourth power bond pads 514d for the input-output circuits, and signal bond pads 514e. The bond pads 514a–e (only a few of many such bond pads are shown for illustrative clarity) connect on a one to one basis with the top traces 512a–e, respectively (only a few of many such top traces are shown for illustrative clarity), using wire bonds 526a–e (only a few of many such wire bonds are shown for illustrative clarity). The semiconductor die may alternatively be mechanically and electrically connected to the package substrate 504 using flip chip (not illustrated) or tape automated bonding (not illustrated) technology without departing from the spirit of the present invention.

As best viewed in FIG. 5a, 5c, 5d and 5e, assembly 500 further has three dielectric layers 506a,b,c (best viewed in FIG. 5a), a first conductive pattern comprising first and third conductive planes 524a and 524c (best viewed in FIG. 5d, and partially illustrated in quadrant 52 in FIG. 5c), and a second conductive pattern comprising second and fourth conductive planes 524b and 524d (best viewed in FIG. 5e, partially illustrated in quadrant 53 in FIG. 5c). Dielectric layer 506a insulates the top traces 512a–e from the first and third conductive planes 524a and 524c. Dielectric layer 506b insulates the first and third conductive planes 524a and 524c from the second and fourth conductive planes 524b and 524d. And dielectric layer 506c insulates the second and fourth conductive planes 524b and 524d from both the bottom traces 518a–e and the external connectors 522a–e. The dielectric layers 506a,b,c may be fabricated from epoxy, polyimide, fiberglass reinforced plastic, ceramic, PTFE or the like. The conductive planes may be fabricated from gold alloys, aluminum alloys, copper alloys or the like.

The first and third conductive planes 524a and 524c are electrically separated from each other by an insulating gap 530a. Preferably the first conductive plane 524a is an island centrally located within, and encircled by, the third conductive plane 524c (best viewed in FIG. 5d). Similarly, second and fourth conductive planes 524b and 524d are electrically separated from each other by another insulating gap 530b. Preferably the second conductive plane 524b is an island centrally located within, and encircled by, the fourth conductive plane 524d (best viewed in FIG. 5e).

As best viewed in FIG. 5b and 5c, each top trace 512e used to carry signals to or from the die 502 is connected on a one to one basis to a respective bottom trace 518e and an external connector 522e by a signal via 538 (only one of many such signal vias 538 are shown in FIG. 5b for illustrative clarity). The signal vias 538 pass through the three dielectric layers 506a,b,c, and pass through electrically insulating holes 528 in the third and fourth conductive planes 524c and 524d.

The first conductive plane 524a is connected to the top traces 512a by top vias 534a, and the first conductive plane is also connected to the bottom traces 518a by bottom vias 536a forming a first power pathway which connects the first power bond pads 514a to the external connectors 522a. The second conductive plane 524b is connected to the top traces 512b by top vias 534b, and the second conductive plane is also connected to the bottom traces 518b by bottom via 536b forming a second power pathway which connects the second power bond pads 514b to the external connectors 522b. The first and second conductive planes 524a and 524b each have insulated holes through which top vias 524b and bottom vias 526a may respectively pass. The first and second conductive planes 524a and 524b, in a biplanar relationship and separated by dielectric layer 506b, form a first pair of conductive planes forming an electrical capacitance when a first voltage is applied to the external connectors 522a and a second voltage is applied to the external connectors 522b.

The third conductive plane 524c is connected to the top traces 512c by top vias 534c, and the third conductive plane is also connected to the bottom traces 518c by bottom vias 536c forming a third power pathway which connects the third power bond pads 514c to the external connectors 522c. The fourth conductive plane 524d is connected to the top traces 512d by top vias 534d, and the fourth conductive plane is also connected to the bottom traces 518d by bottom vias 536d forming a fourth power pathway which connects the fourth power bond pads 514d to the external connectors 522d. The third and forth conductive planes 524c and 524d each have insulated holes through which top vias 524d and bottom vias 526c may respectively pass. The third and fourth conductive planes 524c and 524d, in a biplanar relationship and separated by dielectric layer 506b, form a second pair of conductive planes forming an electrical capacitance when a third voltage is applied to the external connectors 522c and a fourth voltage is applied to the external connectors 522d.

The signal vias 538, the top vias 534a–d, and the bottom vias 536a–d, are preferably plated through holes, and may be fabricated from gold alloys, aluminum alloys, copper alloys or the like.

As illustrated in this embodiment, the semiconductor die 502 first and second power bond pads 514a and 514b for the core circuits are decoupled from the third and fourth power bond pads 514c and 514d for the input-output circuits, thereby reducing noise induced false switching in the core circuits and/or the input-output circuits. Although not illustrated, it is contemplated that, without departing from the spirit of the present invention, the core circuits first and second power bond pads 514a and 514b may be alternatively connected to the third and fourth conductive planes 524c and 524d, respectively, and the input-output circuits third and fourth power bond pads 514c and 514d may be alternatively connected to the first and second conductive planes 524a and 524b.

Figure 6A:
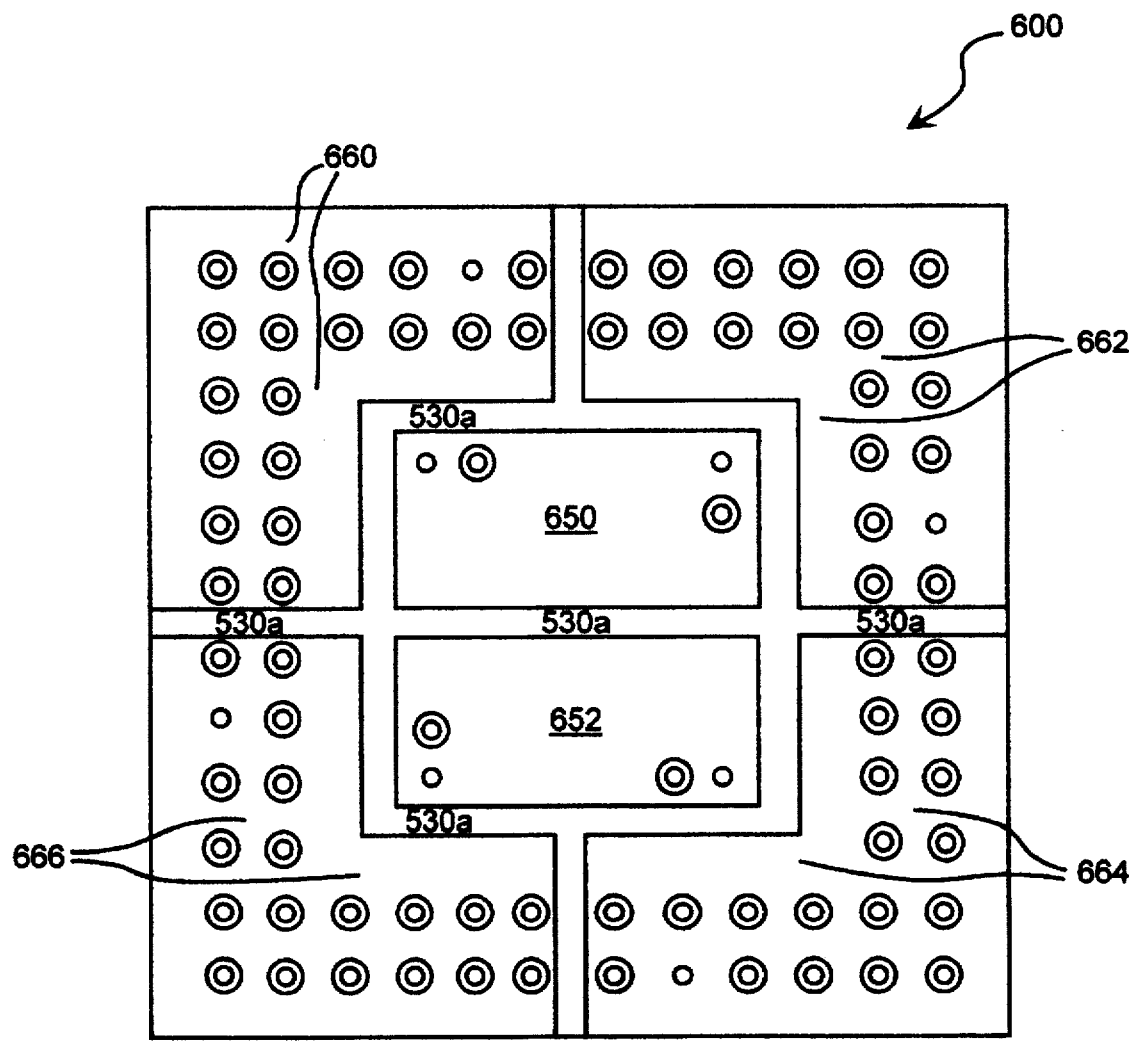
FIGS. 6a and 6b are two schematic cut out plan views an aspect of the present invention.
Figure 6B:
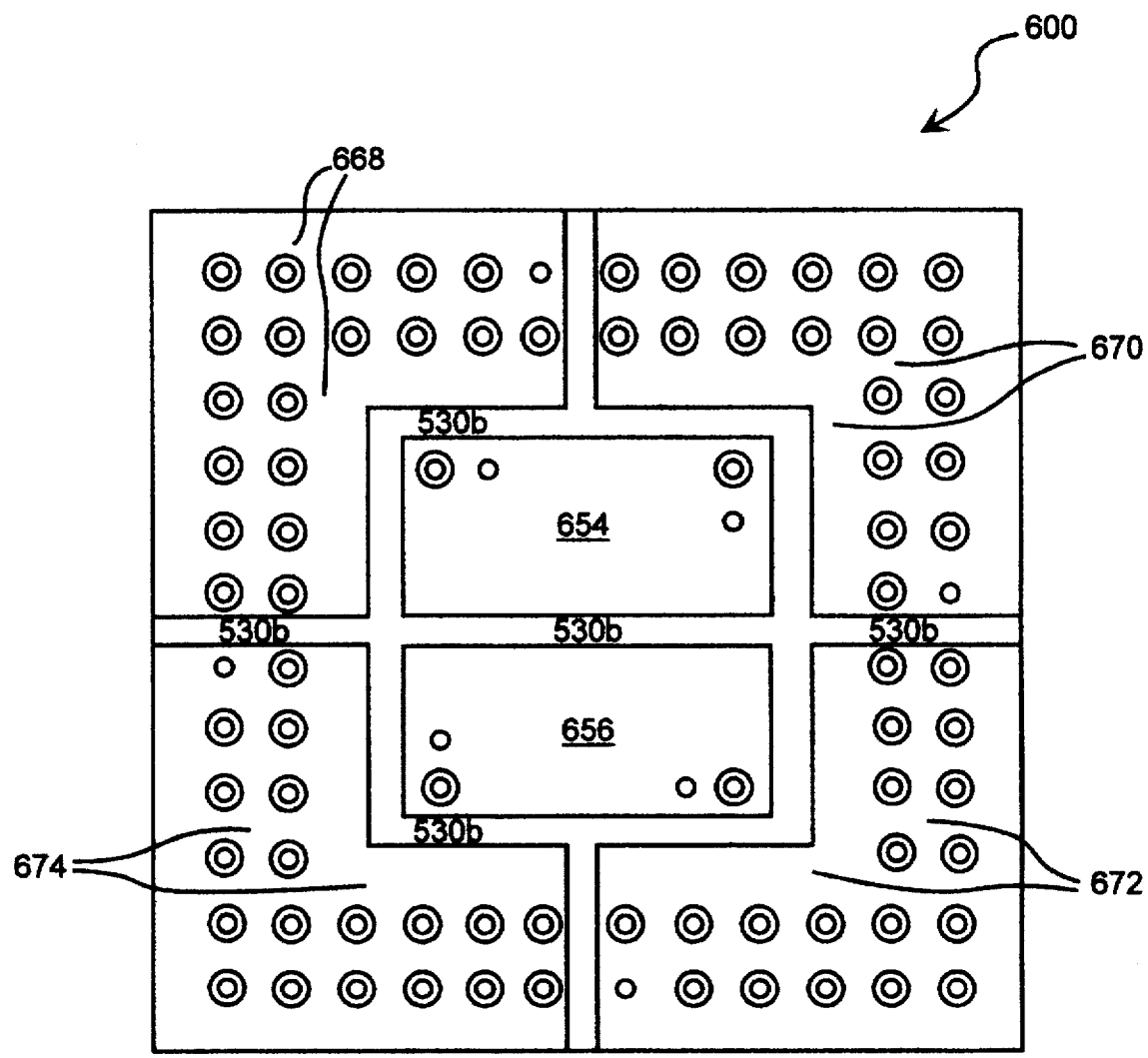

Referring now to FIGS. 6a and 6b, an aspect of the present invention is illustrated in schematic cut out plan view. For the purpose of illustration, assume the die, bond pads, bond wires, top traces, top vias, bottom vias, signal vias, dielectric layers, bottom traces, and external connectors in assembly 600 are identical to the die 502, bond pads 514a–e, bond wires 526a–e, top traces 512a–e, top vias 534a–d, bottom vias 536a–d, signal vias 538, dielectric layers 506a–c, bottom traces 518a–e, and external connectors 522a–e in assembly 500 (as illustrated in FIGS. 5a, 5b, 5c, 5d and 5e). FIG. 6a shows the aspect of the present invention where, for the purpose of illustration, the first dielectric layer 506a has been cut out to expose the first conductive pattern. FIG. 6b shows the present invention where, for the purpose of illustration, the first and second dielectric layers 506a and 506b have been cut out to expose the second conductive pattern.

Should it be desirable to isolate some core circuits from other core circuits, and/or some input-output circuits from other input-output circuits in the semiconductor die 502, the biplanar pair of first and second conductive planes 524a and 524b, and/or the biplanar pair of third and fourth conductive planes 524c and 524d may be subdivided into electrically separate biplanar pairs of subplanes. Such biplanar subplane pairs can further minimize ground bounce and noise induced false switching in the core circuits and/or the input-output circuits.

For example, FIG. 6a shows how the first conductive plane 524a may be subdivided into two electrically separate subplanes 650 and 652, and the third conductive plane 524c may be subdivided into four electrically separate subplanes 660, 662, 664, 666, by selectively extending the insulating gap 530a (which serves to electrically separate the first and third conductive planes 524a and 524c) into the selected conductive planes. FIG. 6b shows how the second conductive plane 524b may be subdivided into two electrically separate subplanes 654 and 656 (respectively forming biplanar pairs with conductive subplanes 650 and 652), and the fourth conductive plane 524d may be subdivided into four electrically separate subplanes 668, 670, 672, 674 (respectively forming biplanar pairs with conductive subplanes 660, 662, 664 and 666), by selectively extending the insulating gap 530b(which serves to electrically separate the first and third conductive planes 524b and 524d) into the selected conductive planes.

It is contemplated, and within the spirit of the present invention, that the biplanar pair of first and second conductive planes 524a and 524b, and the biplanar pair of third and fourth conductive planes 524c and 524d may be subdivided into two or more biplanar pairs of subplanes as may be required for the specific application of the present invention.

Figure 7:
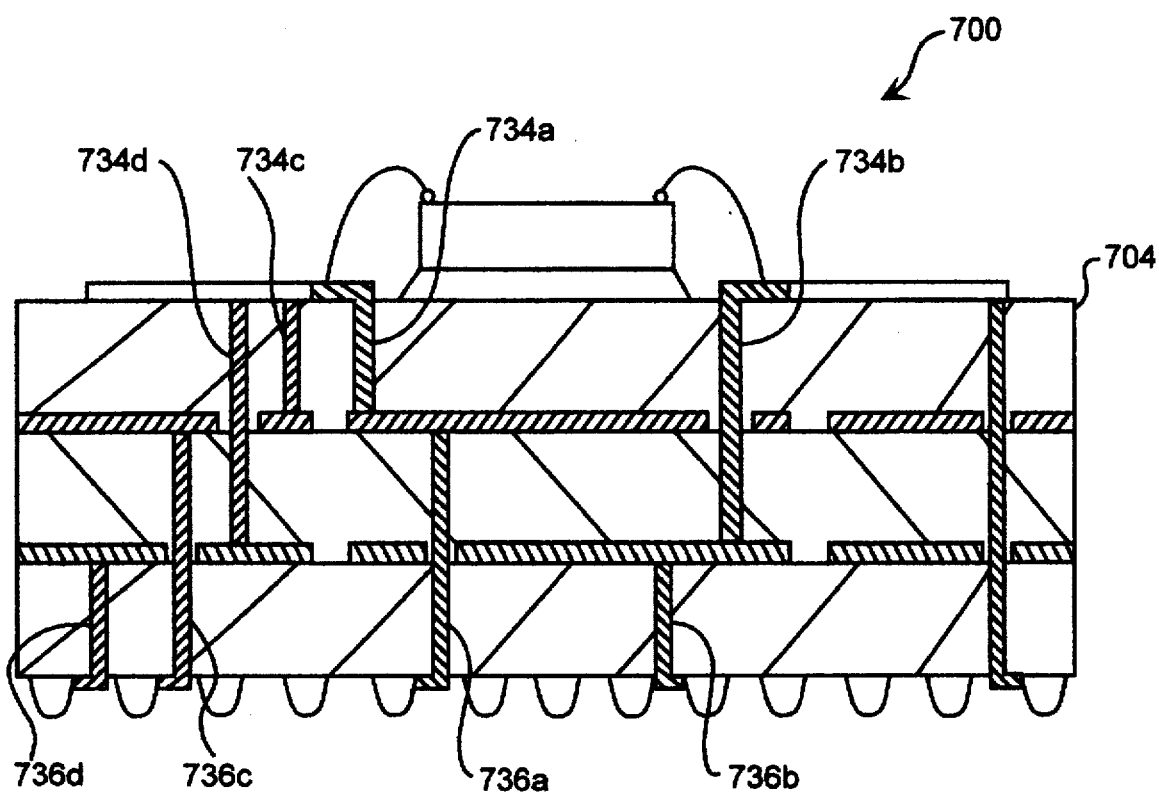
FIG. 7 is a schematic cutaway elevational view of another aspect of the present invention.

Referring now to FIG. 7, another aspect of the present invention is illustrated in schematic cutaway elevational view. Here semiconductor device assembly 700 shows an alternative deployment of the top vias 734a–d with respect to the bottom vias 736a–d in package substrate 704. In assembly 500, discussed above, the top vias 534a–d were located directly above, and aligned with, the corresponding bottom vias 536a–d (e.g. a top via 534a shared a common axis with a bottom via 536a)(also known as "through vias"). In assembly 700, the top vias 734a–d are not located directly above, or are aligned with, the corresponding bottom vias 736a–e (e.g. a top via 734a does not share a common axis with a bottom via 736a)(also known as "blind vias").

It is contemplated, and within the spirit of the present invention that a package substrate may have both through vias as illustrated in FIG. 5b (e.g. 534a–d and 536a–d) and blind vias as illustrated in FIG. 7 (e.g. 734a–d and 736a–d).

Although both assemblies 500 and 700 were, for the purpose of illustrative clarity, shown as having the same number of top vias as bottom vias, it is contemplated, and within the spirit of the present invention, that a package may have a greater number, the same number, or a lesser number of top vias than bottom vias. The quantity and placement of the top vias will be dictated by the quantity and location of power bond pads 514a–d on the semiconductor die (or dice), whereas the quantity and placement of the bottom vias will be dictated by the requirements of the external system.

Figure 8A:
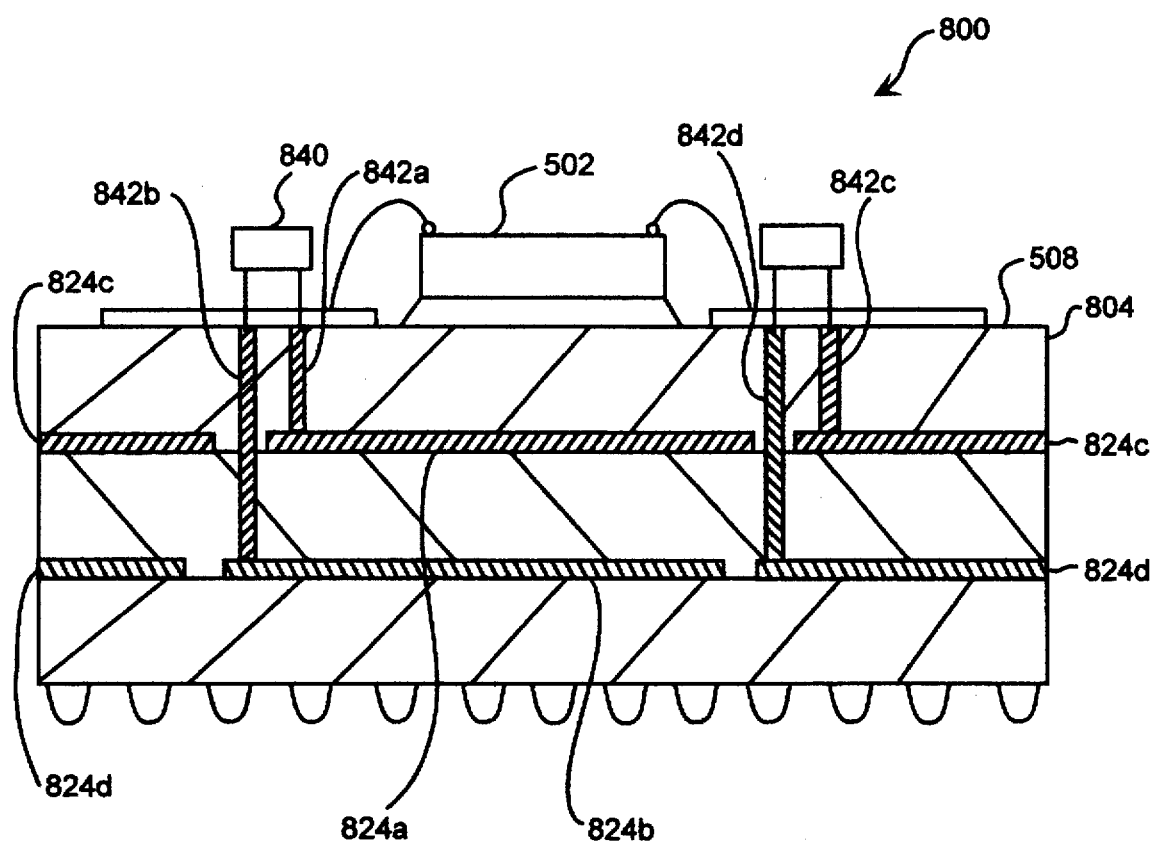
FIG. 8a is a schematic cutaway elevational view of another aspect of the present invention.
Figure 8B:
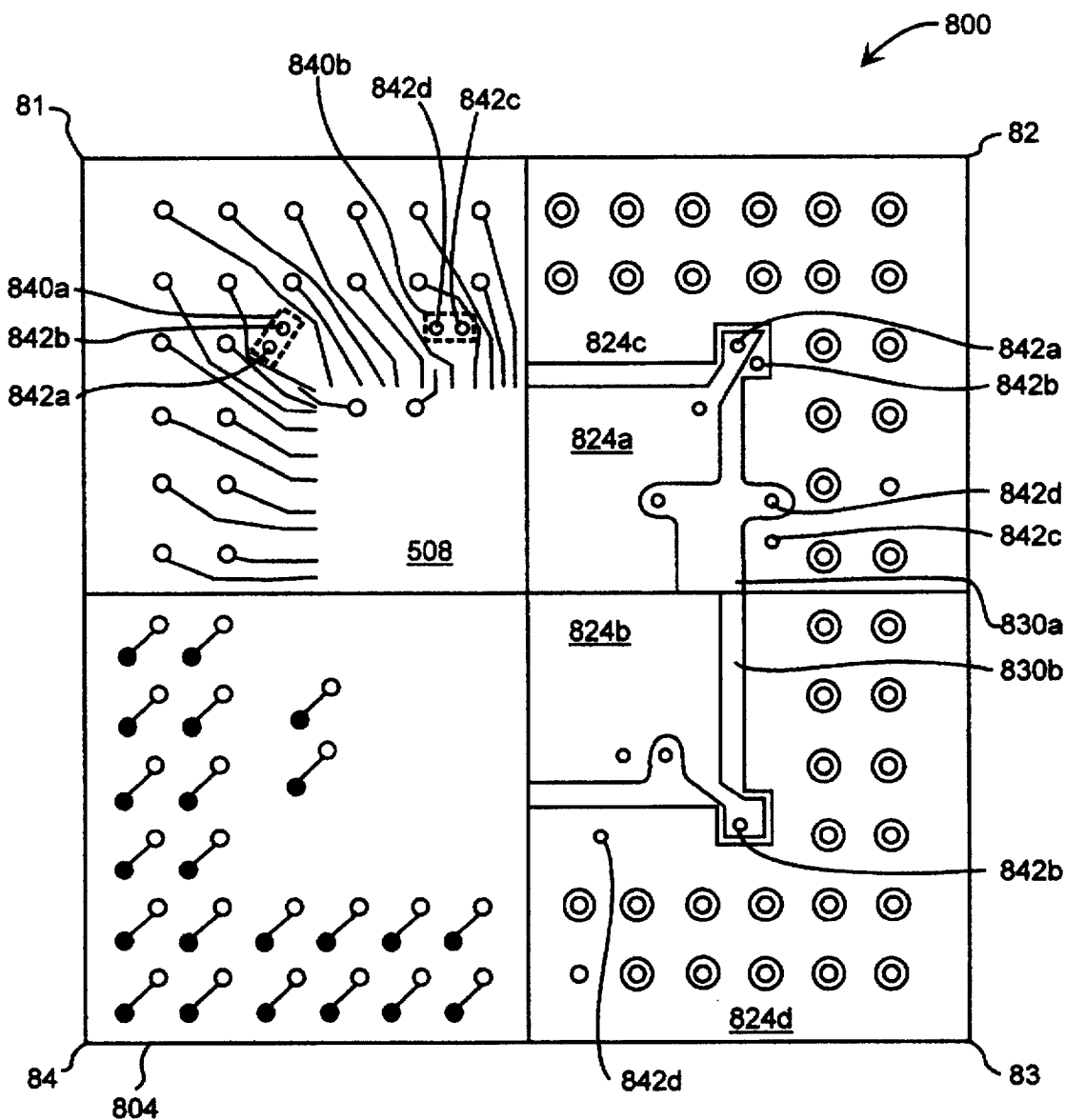
FIG. 8b is a schematic partial cut out plan view of another aspect of the present invention.

Referring now to FIGS. 8a and 8b, another aspect of the present invention is illustrated. FIG. 8a is a schematic cutaway elevational view of semiconductor device assembly 800. For the purpose of clarity, FIG. 8a does not illustrate top or bottom power vias, or signal vias, so as to provide an unobstructed view of the present aspect of the invention. FIG. 8b illustrates the present invention in schematic partial cut out plan view where three quadrants 82, 83 and 84 of the semiconductor device assembly 800 have been carved out to successively greater depths (i.e. from the top surface to the bottom surface) for the purpose of illustration.

Semiconductor device assembly 800 has a semiconductor die 502 (not illustrated in FIG. 8b) and a package substrate 804. The package substrate 804 illustrates several aspects of the present invention. First, if further noise reduction is required in the core circuit power pathways and/or to the input-output power pathways, one or more chip capacitors may be connected to the first pair of biplanar conductive planes 824a and 82 4b and/or one or more chip capacitors may be connected to the second pair of biplanar conductive planes 824c and 824d.

For example, assuming the top vias, bottom vias and signal vias in assembly 800 are identical to the top vias 534a–d, bottom vias 536a–d and signal vias 538 in assembly 500 (as illustrated in FIGS. 5b and 5c), to further reduce noise in the core circuit power pathways, one or more chip capacitors 840a (represented as a dotted line in quadrant 81 of FIG. 8b) may be located on the top surface 508 of the package substrate 804 and connected to the first and second conductive planes 824a and 824b by first and second capacitor vias 842a and 842b, respectively. To further reduce noise in the input-output circuit power pathways, one or more other chip capacitors 840b (represented as a dotted line in quadrant 81 of FIG. 8b) may be located on the top surface 508 of the package substrate 804 and connected to the third and fourth conductive planes 824c and 824d by first and second capacitor vias 842c and 842d, respectively.

Another aspect of the present invention is best illustrated in FIG. 8b. Referring to quadrants 82 and 83, the first and second insulating gaps 830a and 830b may be irregularly shaped so as to insulate selected vias (such as vias 842b and 842d) or to extend a selected conductive plane (such as plane 842a) so that the plane may connect to a selected via (such as via 842a).

Also, though for the purpose of illustrative clarity, the first, second, third and fourth conductive planes have had a substantially square shape (such as conductive planes 524a–d as illustrated in FIG. 5c) or generally square shape (such as conductive planes 824a–d as illustrated in FIG. 8b), it is contemplated, and within the spirit of the present invention, that the conductive planes not be limited to square, or rectangular, shapes. The shape and size of the conductive planes can be varied depending on the die size, substrate type and routing requirements.

Figure 9A:
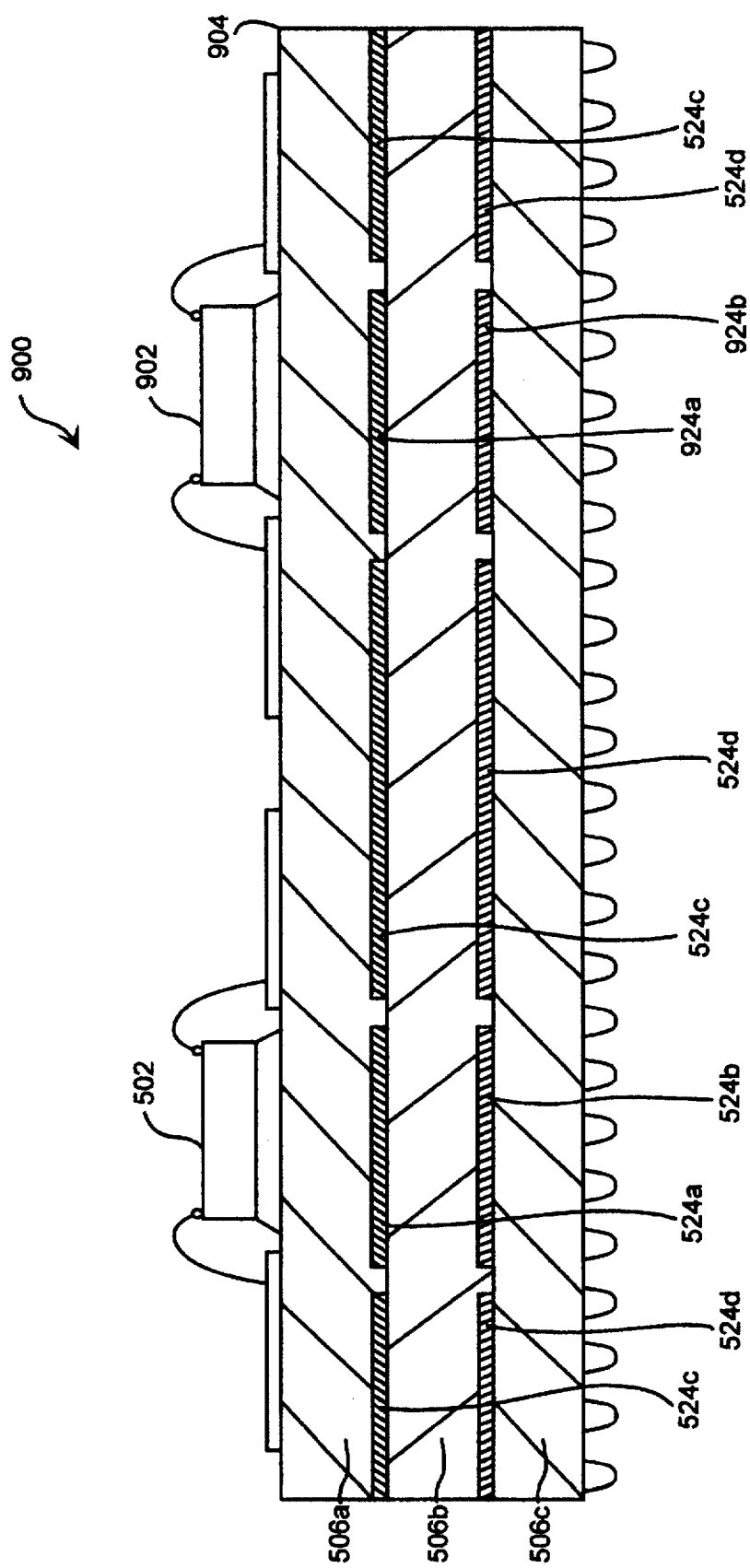
FIGS. 9a and 9b are schematic cutaway elevational views of another aspect of the present invention.
Figure 9B:
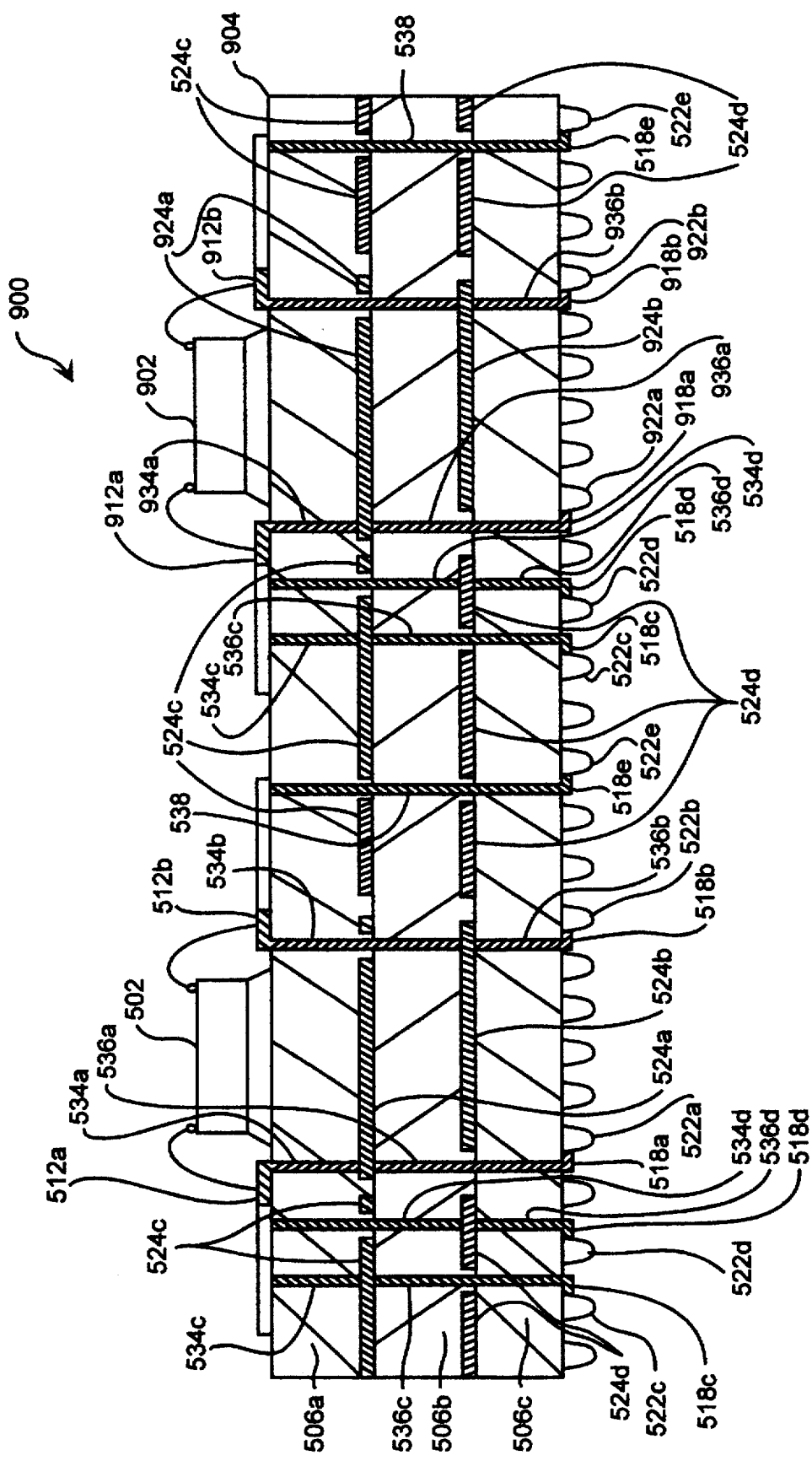
Figure 9C:
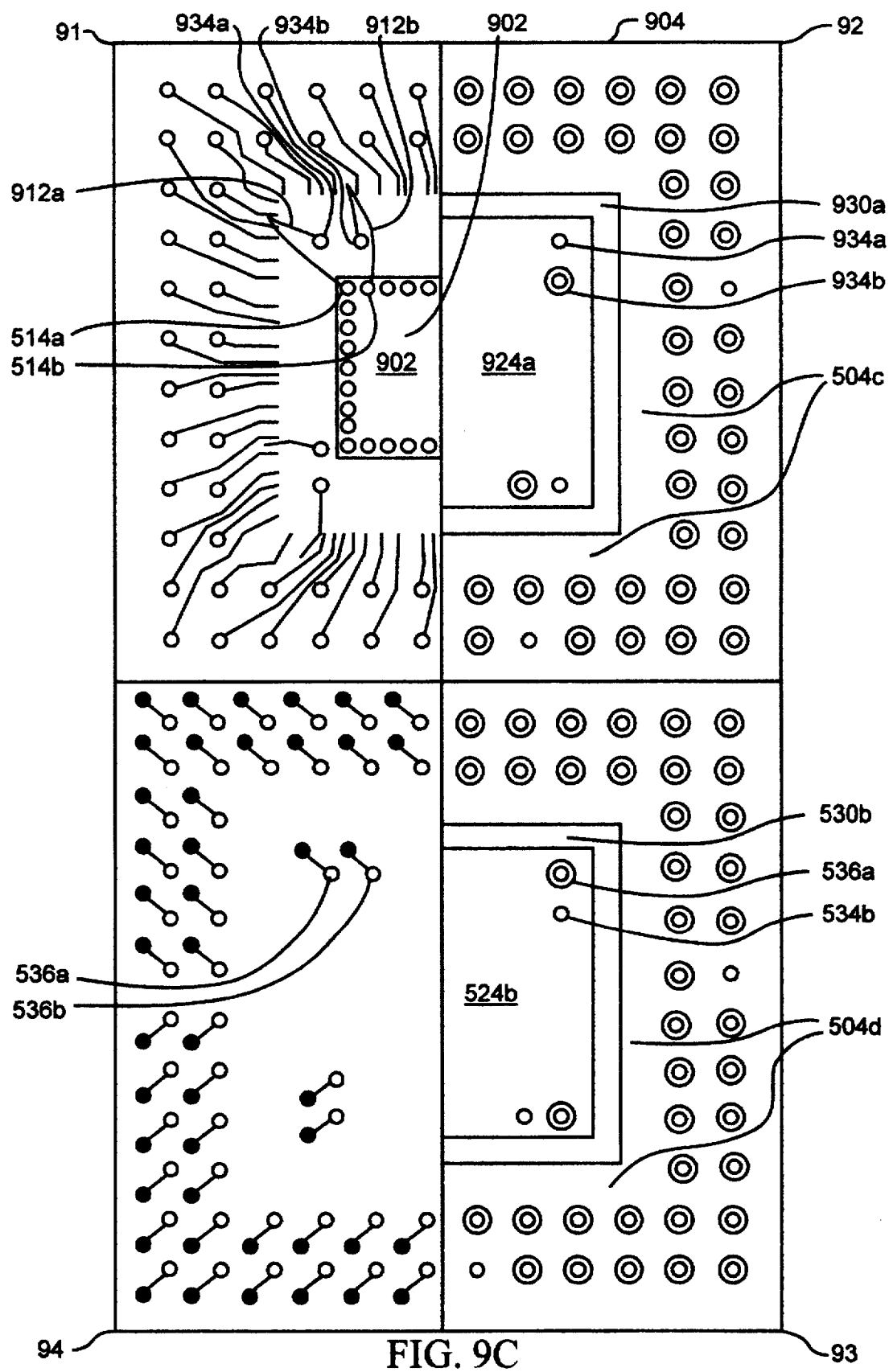
FIG. 9c is a schematic partial cut out plan view of another aspect of the present invention.

Referring now to FIGS. 9a, 9b, 9c, 9d and 9e, another aspect of the present invention is illustrated. FIGS. 9a and 9b are schematic cutaway elevational views of semiconductor device assembly 900. For the purpose of clarity, FIG. 9a does not illustrate top or bottom power vias, or signal vias, so as to provide an unobstructed view of the present aspect of the invention. FIG. 9b shows how the conductive planes are integrated with the vias. FIG. 9c illustrates the present invention in schematic partial cut out plan view where three quadrants 92, 93 and 94 of the semiconductor device assembly 900 have been carved out to successively greater depths (i.e. from the top surface to the bottom surface) for the purpose of illustration.

Figure 9D:
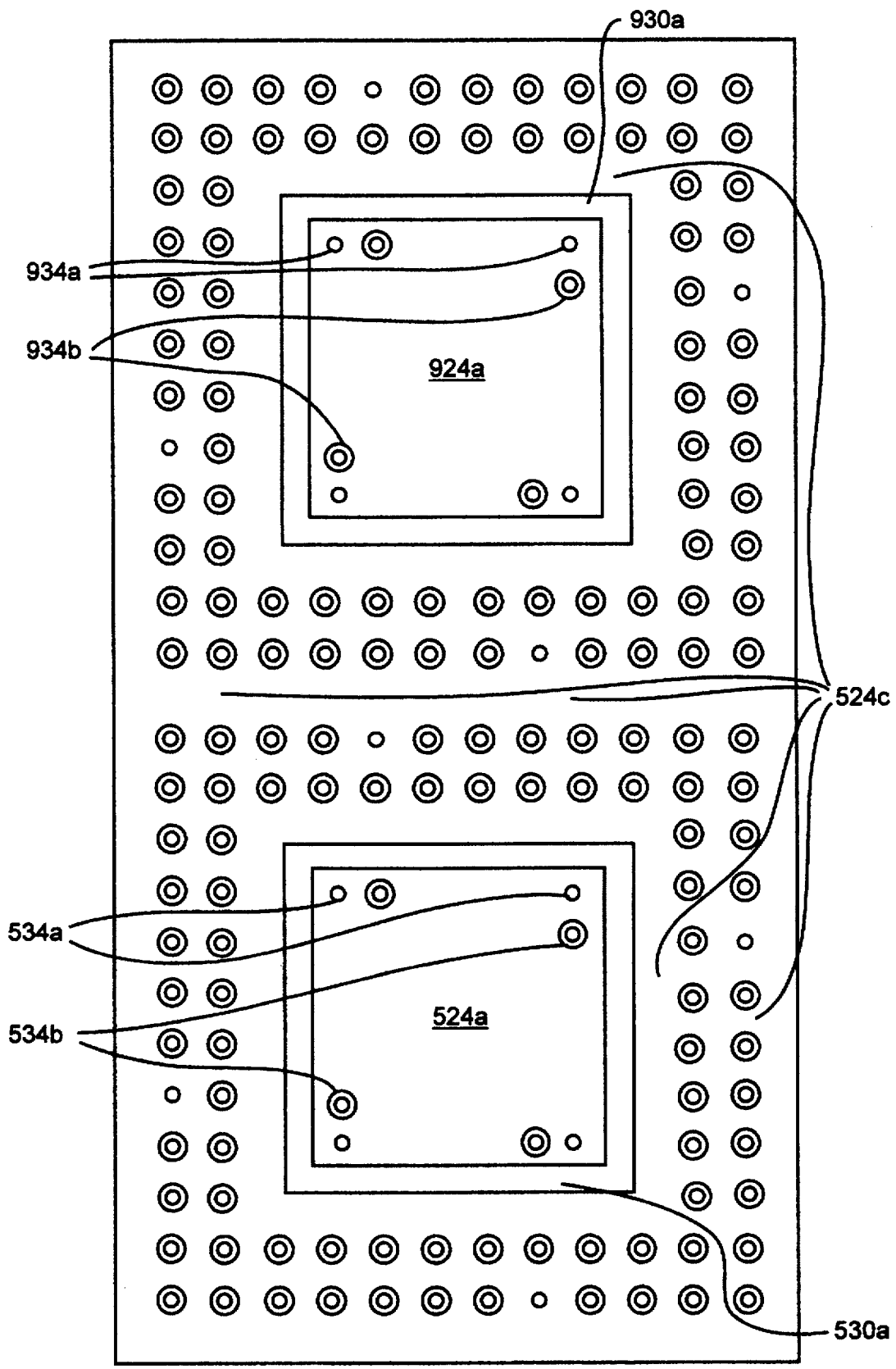
FIGS. 9d and 9e are two schematic cut out plan views of the present invention.
Figure 9E:
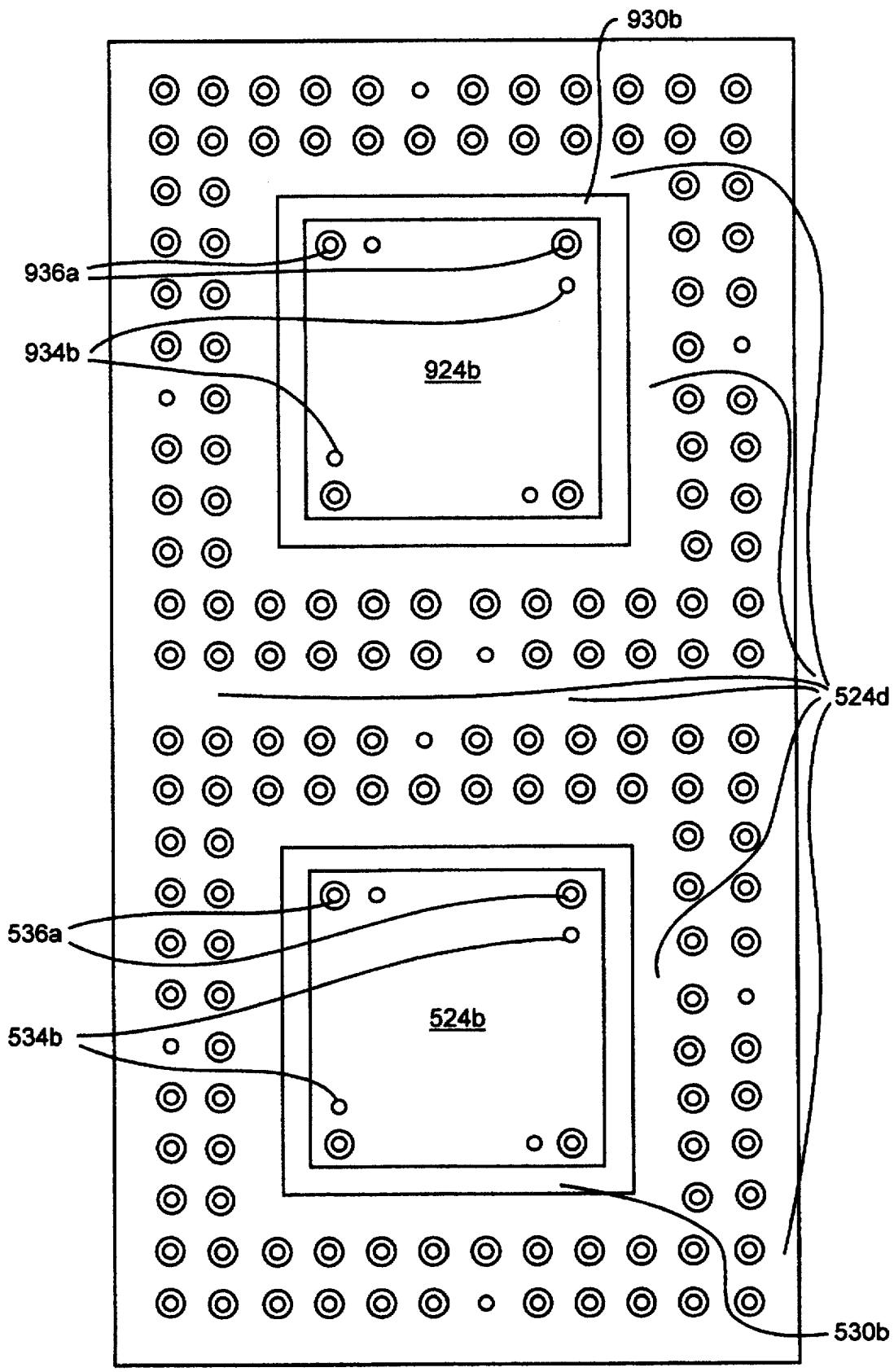

FIGS. 9d and 9e illustrate the present invention in two schematic cut out plan views. FIG. 9d shows the present invention where, for the purpose of illustration, the first dielectric layer 506a has been cut out to expose the first conductive pattern. FIG. 9e shows the present invention where, for the purpose of illustration, the first and second dielectric layers 506a and 506b have been cut out to expose the second conductive pattern.

Semiconductor device assembly 900 shows the present invention adapted for a multi-chip set configuration (i.e. two or more semiconductor dice on a single package substrate). Semiconductor device assembly 900 has a first semiconductor die 502 (not illustrated in FIG. 9c) and a second semiconductor die 902 (partially illustrated in quadrant 91 in FIG. 9c) and a package substrate 904.

For the purpose of illustration, and not limitation, assume both semiconductor dice 502 and 902 illustrated in FIGS. 9a and 9b are identical to the semiconductor die 502 illustrated in FIGS. 5a, 5b and 5c.

Also, assume semiconductor die 502 (as illustrated in FIGS. 9b and 9c) is connected to top traces, top vias, conductive planes, bottom vias, signal vias, bottom traces, and external connectors, as semiconductor die 502 (as illustrated in FIGS. 5b and 5c, and as discussed in the text accompanying FIGS. 5a–5e) is to top traces 512a–e, top vias 534a–d, conductive planes 524a–d, bottom vias 536a–d, signal vias 538, bottom traces 518a–e, and external connectors 522a–e.

Further, assume semiconductor die 902 (as illustrated in FIGS. 9b and 9c) is connected to top traces, top vias, bottom vias, signal vias, bottom traces, and external connectors, as semiconductor die 502 (as illustrated in FIGS. 5b and 5c, and as discussed in the text accompanying FIGS. 5a–5e) is to top traces 512a–e, top vias 534c–d, conductive planes 524c–d, bottom vias 536c–d, signal vias 538, bottom traces 518c–e, and external connectors 522c–e.

As best viewed in FIGS. 9d and 9e, the first conductive pattern has a fifth conductive plane 924a and the second conductive pattern has a sixth conductive plane 924b. The fifth conductive plane 924a is coplanar with the third conductive plane 524c and separated from same by an insulating gap 930a. The sixth conductive plane 924b is coplanar with the third conductive plane 524d and separated from same by an insulating gap 930b. As best viewed in FIGS. 9a and 9b, the fifth conductive plane 924a and the sixth conductive plane 924b form a biplanar pair and are separated from one another by the second dielectric layer 506b.

The first power bond pads 514a for the core circuits on semiconductor die 902 are connected to the fifth top traces 912a, which are connected to the fifth top vias 934a, which are connected to the fifth conductive plane 924a, which is connected to the fifth bottom vias 936a, which are connected to the fifth bottom traces 918a, which terminate in the fifth external connectors 922a. Similarly, the sixth power bond pads 514b for the core circuits on semiconductor die 902 are connected to the sixth top traces 912b, which are connected to the sixth top vias 934b, which are connected to the sixth conductive plane 924b, which is connected to the sixth bottom vias 936b, which are connected to the sixth bottom traces 918b, which terminate in the sixth external connectors 922b.

In this manner, the core circuits of both dice 502 and 902 are decoupled from the input-output circuits of both dice 502 and 902. Also the core circuits of die 502 are decoupled from the core circuits of die 902. Although not illustrated, it is contemplated, and within the spirit of this invention, that the third and fourth conductive planes may be subdivided (analogous to the text discussing plane subdivision in conjunction with FIGS. 6a and 6b) so as to decouple the input-output circuits of die 502 from the input-output circuits of die 902.

It is contemplated, and within the spirit of the present invention, that the core circuits of both dice 502 and 902 may be connected to the same or different power supplies providing substantially similar or substantially different voltage potentials. If the third and fourth conductive planes are subdivided between the dice 502 and 902, it is contemplated, and within the spirit of the present invention, that the input-output circuits of both dice 502 and 902 may be connected to the same or different power supplies providing substantially similar or substantially different voltage potentials.

Although not illustrated, it is contemplated, and within the spirit of this invention, that the first and second conductive planes 524a and 524b forming "islands" may each be connected by a conductive "isthmus" to the fifth and sixth conductive planes 924a and 924b forming "islands", respectively. This would act to electrically couple the core circuits of dice 502 and 902. In this manner, though the core circuits of both dice are coupled, and the input-output circuits of both dice are coupled, the core circuits of both dice are still decoupled from the input-output circuits of both dice.

Other and further objects, features and advantages will be apparent from the following description of the presently preferred embodiments of the invention, given for the purpose of disclosure and taken in conjunction with the accompanying drawings.

The present invention, therefore, is well adapted to carry out the objects and attain the ends and advantages mentioned, as well as others inherent therein. While presently preferred and most preferred embodiments of the invention have been given for purposes of disclosure, numerous changes in the details of construction, interconnection and arrangement of parts will readily suggest themselves to those skilled in the art and which are encompassed within the spirit of the invention and the scope of the appended claims.

What is claimed is:

1. A semiconductor device assembly, comprising:
   a package substrate comprising a top surface, a bottom surface, first and second conductive patterns, and first, second and third dielectric layers,
      the first dielectric layer disposed between the top surface and the first conductive pattern, the second dielectric layer disposed between the first and second conductive patterns, and the third dielectric layer disposed between the second conductive pattern and the bottom surface,
      the bottom surface having a plurality of first external connectors, a plurality of second external connectors, a plurality of third external connectors, a plurality of fourth external connectors, and a plurality of signal external connectors,
      the first conductive pattern having a first plane and a third plane, the first plane connected to the plurality of first external connectors, and the third plane connected to the plurality of third external connectors,
      the second conductive pattern having a second plane and a fourth plane, the second plane connected to the plurality of second external connectors, and the fourth plane connected to the plurality of fourth external connectors, the first and second planes positioned in a biplanar relationship for forming an electrical capacitance, and the third and fourth planes positioned in a biplanar relationship for forming an electrical capacitance; and
   a semiconductor die having core circuits and input-output circuits, said semiconductor die located on the top surface of said package substrate, said semiconductor die comprising:
      a plurality of first power bond pads for the core circuits, the plurality of first power bond pads connected to the first plane,
      a plurality of second power bond pads for the core circuits, the plurality of second power bond pads connected to the second plane,
      a plurality of third power bond pads for the input-output circuits, the plurality of third power bond pads connected to the third plane,
      a plurality of fourth power bond pads for the input-output circuits, the plurality of fourth power bond pads connected to the fourth plane, thereby decoupling the core circuits of said semiconductor die from the input-output circuits of said semiconductor die, and a plurality of signal bond pads, the plurality of signal bond pads connected to the plurality of signal external connectors of said package substrate.

2. The semiconductor device assembly according to claim 1 wherein the first, second and third dielectric layers of said package substrate are epoxy.

3. The semiconductor device assembly according to claim 1 wherein the first, second and third dielectric layers of said package substrate are polyimide.

4. The semiconductor device assembly according to claim 1 wherein the first, second and third dielectric layers of said package substrate are fiberglass reinforced plastic.

5. The semiconductor device assembly according to claim 1 wherein the first, second and third dielectric layers of said package substrate are ceramic.

6. The semiconductor device assembly according to claim 1 wherein the external connectors are pins.

7. The semiconductor device assembly according to claim 1 wherein the external connectors are solder ball bumps.

8. The semiconductor device assembly according to claim 1 wherein the third plane encircles the first plane, and the fourth plane encircles the second plane.

9. The semiconductor device assembly according to claim 1 further comprising:

at least one chip capacitor having one terminal and another terminal, the one terminal connected to the first plane of said package substrate, and the other terminal connected to the second plane of said package substrate.

10. The semiconductor device assembly according to claim 1 further comprising:

at least one chip capacitor having one terminal and another terminal, the one terminal connected to the third plane of said package substrate, and the other terminal connected to the fourth plane of said package substrate.

11. The semiconductor device assembly according to claim 1 wherein said semiconductor die is a plurality of semiconductor dice.

12. The semiconductor device assembly according to claim 1 wherein the plurality of first external connectors is adapted for connection to a first voltage, the plurality of second external connectors is adapted for connection to a second voltage, the plurality of third external connectors is adapted for connection to a third voltage, and the plurality of fourth external connectors is adapted for connection to a fourth voltage, the first and second voltages derived from a first power supply, and the third and fourth voltages derived from a second power supply.

13. The semiconductor device assembly according to claim 12 wherein the voltage at the plurality of first external connectors is a negative voltage and the voltage at the plurality of second external connectors is a positive voltage with respect to the voltage at the plurality of first external connectors, and the voltage at the plurality of third external connectors is a negative voltage and the voltage at the plurality of fourth external connectors is a positive voltage with respect to the voltage at the plurality of third external connectors.

14. The semiconductor device assembly according to claim 13 wherein the first voltage of the first power supply and the third voltage of the second power supply are connected together.

15. The semiconductor device assembly according to claim 12 wherein the voltage at the plurality of first external connectors is a positive voltage and the voltage at the plurality of second external connectors is a negative voltage with respect to the voltage at the plurality of first external connectors, and the voltage at the plurality of third external connectors is a positive voltage and the voltage at the plurality of fourth external connectors is a negative voltage with respect to the voltage at the plurality of third external connectors.

16. The semiconductor device assembly according to claim 15 wherein the second voltage of the first power supply and the fourth voltage of the second power supply are connected together.

17. The semiconductor device assembly according to claim 12 wherein the voltage difference between the plurality of first external connectors and the plurality of second external connectors is from 4.5 volts to 5.5 volts.

18. The semiconductor device assembly according to claim 17 wherein the voltage difference between the plurality of third external connectors and the plurality of fourth external connectors is from 4.5 volts to 5.5 volts.

19. The semiconductor device assembly according to claim 17 wherein the voltage difference between the plurality of third external connectors and the plurality of fourth external connectors is from 2.5 volts to 4.0 volts.

20. A package substrate for a semiconductor die having core circuits, input-output circuits, a first plurality and a second plurality of power bond pads for the core circuits, a third plurality and a fourth plurality of power bond pads for the input-output circuits, and a plurality of signal bond pads, the package substrate comprising:

a top surface, a bottom surface, first and second conductive patterns, and first, second and third dielectric layers;

the first dielectric layer disposed between the top surface and the first conductive pattern, the second dielectric layer disposed between the first and second conductive patterns, and the third dielectric layer disposed between the second conductive pattern and the bottom surface;

the top surface having a plurality of first traces for connecting to the first plurality of power bond pads, a plurality of second traces for connecting to the second plurality of power bond pads, a plurality of third traces for connecting to the third plurality of power bond pads, a plurality of fourth traces for connecting to the fourth plurality of power bond pads, and a plurality of signal traces for connecting to the plurality of signal bond pads;

the bottom surface having a plurality of first external connectors, a plurality of second external connectors, a plurality of third external connectors, a plurality of fourth external connectors, and a plurality of signal external connectors;

the first conductive pattern having a first plane and a third plane, the first plane connected to the plurality of first traces and the plurality of first external connectors, and the third plane connected to the plurality of third traces and the plurality of third external connectors;

the second conductive pattern having a second plane and a fourth plane, the second plane connected to the plurality of second traces and the plurality of second external connectors, and the fourth plane connected to the plurality of fourth traces and the plurality of fourth external connectors, the first and second planes positioned in a biplanar relationship for forming an electrical capacitance, and the third and fourth planes positioned in a biplanar relationship for forming an electrical capacitance thereby decoupling the core circuits of said semiconductor die from the input-output circuits of said semiconductor die; and the plurality of signal traces connected to the plurality of signal external connectors.

21. A semiconductor device assembly, comprising:

a semiconductor die having core circuits and input-output circuits, said semiconductor die having
  at least one first power bond pad for the core circuits,
  at least one second power bond pad for the core circuits,
  at least one third power bond pad for the input-output circuits,
  at least one fourth power bond pad for the input-output circuits, and
  a plurality of signal bond pads;

a package substrate having first, second, third and fourth conductive patterns, first, second and third dielectric layers, at least one each of a first, second, third and fourth top vias, at least one each of a first, second, third and fourth bottom vias, a plurality of signal vias, at least one each of a first, second, third and fourth external connectors, a plurality of signal external connectors, and a top surface,
  the first dielectric layer disposed between the first and second conductive patterns, the second dielectric layer disposed between the second and third conductive patterns, and the third dielectric layer disposed between the third and fourth conductive patterns,
  the top surface of said package substrate defined by the first dielectric layer and the first conductive pattern disposed thereon, said semiconductor die located adjacent to the top surface;

the first conductive pattern of said package substrate comprising
  an at least first top trace for connecting the at least one first power bond pad to the at least one first top via,
  an at least second top trace for connecting the at least one second power bond pad, to the at least one second top via,
  an at least third top trace for connecting the at least one third bond pad to the at least one third top via,
  an at least fourth top trace for connecting the at least one fourth power bond pad to the at least one fourth top via, and
  a plurality of top signal traces for connecting the plurality of signal bond pads to the plurality of signal vias;

the second conductive pattern of said package substrate comprising at least one each of a first and third planes, the at least one first plane connected to the at least one first top via and the at least one first bottom via, and the at least one third plane connected to the at least one third top via and the at least one third bottom via;

the third conductive pattern of said package substrate comprising at least one each of a second and fourth planes,
  the at least one second plane connected to the at least one second top via and the at least one second bottom via, and the at least one fourth plane connected to the at least one fourth top via and the at least one fourth bottom via,
  the first and second planes positioned in a biplanar relationship for forming an electrical capacitance,
  the third and fourth planes positioned in a biplanar relationship for forming an electrical capacitance; and the fourth conductive pattern of said package substrate comprising
  an at least one first bottom trace for connecting the at least one first bottom via to the at least one first external connector,
  an at least one second bottom trace for connecting the at least one second bottom via to the at least one second external connector,
  an at least one third bottom trace for connecting the at least one third bottom via to the at one third external connector,
  an at least one fourth bottom trace for connecting the at least one fourth bottom via to the at least one fourth external connector, and
  a plurality of bottom signal traces for connecting the plurality of signal vias to the plurality of signal external connectors,
  thereby decoupling the core circuits of said semiconductor die from the input-output circuits of said semiconductor die.

* * * * *